(12) United States Patent
Shimakawa

(10) Patent No.: US 8,787,070 B2
(45) Date of Patent: Jul. 22, 2014

(54) REFERENCE CELL CIRCUIT AND VARIABLE RESISTANCE NONVOLATILE MEMORY DEVICE INCLUDING THE SAME

(75) Inventor: Kazuhiko Shimakawa, Osaka (JP)

(73) Assignee: Panasonic Corporation, Osaka (JP)

( * ) Notice: Subject to any disclaimer, the term of this patent is extended or adjusted under 35 U.S.C. 154(b) by 154 days.

(21) Appl. No.: 13/634,292

(22) PCT Filed: Apr. 12, 2012

(86) PCT No.: PCT/JP2012/002559
§ 371 (c)(1),
(2), (4) Date: Sep. 12, 2012

(87) PCT Pub. No.: WO2012/140903
PCT Pub. Date: Oct. 18, 2012

(65) Prior Publication Data
US 2013/0044535 A1    Feb. 21, 2013

(30) Foreign Application Priority Data

Apr. 13, 2011 (JP) ................................ 2011-089505

(51) Int. Cl.
*G11C 11/00* (2006.01)
*G11C 13/00* (2006.01)

(52) U.S. Cl.
CPC ........ *G11C 13/0002* (2013.01); *G11C 13/0064* (2013.01); *G11C 13/0069* (2013.01); *G11C 13/004* (2013.01)
USPC ................. 365/148; 365/210.1; 365/210.11; 365/210.12; 365/189.07

(58) Field of Classification Search
CPC .......... G11C 13/0002; G11C 13/0064; G11C 13/0069; G11C 13/004
USPC ........ 365/148, 210.1, 210.11, 210.12, 189.07
See application file for complete search history.

(56) References Cited

U.S. PATENT DOCUMENTS 6,608,773 B2 * 8/2003 Lowrey et al. ................. 365/100
6,665,216 B1 * 12/2003 Ho et al. .................. 365/189.07
(Continued)

FOREIGN PATENT DOCUMENTS

| JP | 2003-317466 | 11/2003 |
| JP | 2006-099835 | 4/2006 |

(Continued)

OTHER PUBLICATIONS

International Search Report issued May 22, 2012 in International (PCT) Application No. PCT/JP2012/002559.

*Primary Examiner* — Viet Q Nguyen
(74) *Attorney, Agent, or Firm* — Wenderoth, Lind & Ponack, LLP.

(57) ABSTRACT

Included are reference cells each including a variable resistance element which reversibly changes between a predetermined low resistance state LR and a predetermined high resistance state HR according to an application of an electric signal, a comparator which compares resistance values of the reference cells, a pulse generation circuit which generates an electric signal for setting the reference cells to LR or HR, and a control circuit which controls operations where application of the generated electric signal to one of the reference cells corresponding to a comparison result of the comparator and application of a new electric signal generated by the pulse generation circuit to one of the reference cells corresponding to a new comparison result of the comparator are repeated, and then one of the reference cells corresponding to a final comparison result of the comparator is connected to an output terminal.

24 Claims, 18 Drawing Sheets

(56) References Cited

U.S. PATENT DOCUMENTS

| | | | |
|---|---|---|---|
| 6,697,294 B1* | 2/2004 | Qi et al. | 365/210.15 |
| 6,754,123 B2* | 6/2004 | Perner et al. | 365/209 |
| 6,778,426 B2* | 8/2004 | Hosotani | 365/158 |
| 6,807,088 B2* | 10/2004 | Tsuchida | 365/158 |
| 7,072,236 B2* | 7/2006 | Matsuoka | 365/207 |
| 7,075,813 B2 | 7/2006 | Moriyama et al. | |
| 7,116,598 B2 | 10/2006 | Shimizu et al. | |
| 7,286,429 B1* | 10/2007 | Liaw et al. | 365/209 |
| 7,400,521 B1* | 7/2008 | Hoenigschmid | 365/148 |
| 7,440,314 B2* | 10/2008 | Sakimura et al. | 365/158 |
| 7,813,166 B2* | 10/2010 | Jung et al. | 365/158 |
| 7,815,287 B2* | 10/2010 | Leigh et al. | 347/49 |
| 7,843,716 B2* | 11/2010 | Kang et al. | 365/51 |
| 8,031,508 B2 | 10/2011 | Toda et al. | |
| 8,036,015 B2 | 10/2011 | Ueda et al. | |
| 8,094,480 B2 | 1/2012 | Tonomura | |
| 8,189,363 B2 | 5/2012 | Tsuchida et al. | |
| 2005/0122816 A1 | 6/2005 | Moriyama et al. | |
| 2006/0067149 A1 | 3/2006 | Shimizu et al. | |
| 2009/0122598 A1 | 5/2009 | Toda et al. | |
| 2009/0296452 A1 | 12/2009 | Tonomura | |
| 2010/0046274 A1 | 2/2010 | Tsuchida et al. | |
| 2010/0165701 A1 | 7/2010 | Ueda et al. | |
| 2012/0008372 A1 | 1/2012 | Toda et al. | |

FOREIGN PATENT DOCUMENTS

| | | |
|---|---|---|
| JP | 2008-217842 | 9/2008 |
| JP | 2009-117006 | 5/2009 |
| JP | 2009-289352 | 12/2009 |
| JP | 2010-049730 | 3/2010 |
| JP | 2010-049751 | 3/2010 |
| JP | 2010-211884 | 9/2010 |

* cited by examiner

REFERENCE CELL CIRCUIT AND VARIABLE RESISTANCE NONVOLATILE MEMORY DEVICE INCLUDING THE SAME

TECHNICAL FIELD

The present invention relates to a variable resistance nonvolatile memory device which includes memory cells each including a variable resistance memory element which has a resistance value that reversibly changes based on an electric signal.

BACKGROUND ART

In recent years, progressive research and development has been conducted on nonvolatile memory devices which includes memory cells having variable resistance memory elements. A variable resistance memory element is an element which has a property where the resistance value reversibly changes according to an electrical signal, and which enables data corresponding to the resistance value to be written in a nonvolatile manner. Examples of the variable resistance memory element include a resistance random access memory (ReRAM) which is based on changes in electric resistance value caused due to oxidation-reduction reaction, a magnetoresistive random access memory (MRAM) which is based on changes in magnetroresistance, and a phase change random access memory (PCRAM) which is based on changes in electric resistance value caused due to phase change.

One example of a known nonvolatile memory device which includes the variable resistance memory elements is a so-called 1T1R type nonvolatile memory device in which a metal oxide semiconductor (MOS) transistor and a variable resistance memory element are connected in series at respective crosspoints of a bit line, a word line, and a source line that are orthogonally arranged. Another example is a so-called crosspoint type nonvolatile memory device in which a diode element and a variable resistance memory element are connected in series at respective crosspoints of a bit line and a word line that are orthogonally arranged in a similar manner.

For reading data from a memory device, a reference cell method (also referred to as a dummy cell method) is commonly used. In the method, reference cells (also referred to as dummy cells) are formed, each of which has an intermediate state of written information corresponding to the stored data "1" and data "0", and information read from each memory cell is compared with the intermediate state to determine whether the read information is data "1" or data "0". In the case of the nonvolatile memory device which includes the variable resistance memory elements, reference cells are formed, each of which has a resistance value of an intermediate state between a high resistance state and a low resistance state.

Patent Literature 1 discloses a configuration of a memory circuit of an MRAM with reduced number of reference cells. FIG. 18 illustrates a circuit configuration of an MRAM device where a first memory cell array 1001 and a second memory cell array 1002, each of which has MRAM elements, are arranged horizontally with a sense amplifier 1005 therebetween. In addition, a first reference cell array 1003 is arranged adjacent to the first memory cell array 1001, and a second reference cell array 1004 is arranged adjacent to the second memory cell array 1002. When a memory cell MC included in the first memory cell array 1001 is selected for reading, a reference cell RC included in the second reference cell array 1004 is selected and the resistance values of the selected cells are compared by the sense amplifier 1005. When a memory cell MC included in the second memory cell array 1002 is selected for reading, a reference cell RC included in the first reference cell array 1003 is selected and the resistance values of the selected cells are compared by the sense amplifier 1005.

Each reference cell RC includes a fixed resistance element having a resistance value (reference value) between a low resistance state and a high resistance state of the memory cell MC. More specifically, the reference cell RC is formed by the process structure same as that of the memory cell MC, and has a fixed resistance value adjusted to a desired value by fixing the magnetization direction, and further changing the area of the ferromagnetic layer. Patent Literature 1 discloses a configuration where, for example, only a top 1-bit RCL 1 is used in the reference cell array 1003, and, for example, only a top 1-bit RCR 1 is used in the reference cell array 1004, thereby reducing the number of reference cells.

Patent Literature 2 discloses a crosspoint type ReRAM configuration including reference cells that can be trimmed.

FIG. 19 is a diagram of a basic configuration of a ReRAM device where a read operation is performed by comparing, using a sense amplifier 1012, a current flowing in a memory cell MC which is included in a memory cell array 1010 and in which a variable resistance element VR and a diode D1 are connected in series, with a current flowing in a reference cell block 1011 which has the same configuration as the memory cell MC. Here, the reference cell RCs in the reference cell block 1011 have the same cell configuration as the memory cells in the memory cell array 1010. The variable resistance element VRs in the reference cell RCs are set to the highest resistance state of all of the cells, that is, to the lowest memory cell current state. The variable resistance element VRs are connected in parallel. The number of reference cell RCs that are connected in parallel is trimmed to optimize the reference current value for reading data of the memory cell array 1010.

CITATION LIST

Patent Literature

[PTL 1]
Japanese Unexamined Patent Application Publication No. 2010-49730 (FIG. 2)
[PTL2]
Japanese Unexamined Patent Application Publication No. 2009-117006 (FIG. 2)

SUMMARY OF INVENTION

Technical Problem

In general, even though the memory cells included in the memory cell array have the same memory cell configuration, the feature size and thickness of individual memory cell vary. As a result, the physical amount written to each memory cell differs slightly for every 1 bit.

FIG. 1 is a schematic chart of resistance value distribution of memory cells to which a high resistance state or a low resistance state is written, in a variable resistance nonvolatile memory device including a memory cell array having N-bit memory cells. In the case of the variable resistance memory element, information stored to each memory cell corresponds to at least two resistance states including a low resistance (abbreviated to LR) state in which the memory cell has a resistance value within a first range and a high resistance (abbreviated to HR) state in which the memory cell has a resistance value within a second range having a lower limit value higher than the upper limit value of the first range.

In the entire memory cell array, the resistance values of the memory cells distribute with a certain range of variability, as shown in FIG. 1 where the lower limit value is LRmin and the upper limit value is LRmax in the distribution for the LR state and the lower limit value is HRmin and the upper limit value is HRmax in the distribution for the HR state.

For such a case, a reference cell method, which performs read operations by comparison with a predetermined reference level, is known as an effective method for stable read operations. In the reference cell method, each reference cell is often set to an intermediate value between the LRmax and the HRmin (referred to as a reference resistance value). More preferably, in view of various margins of reading speed or data retention characteristics, an optimized design is provided by setting the reference cell slightly to a high resistance side, or slightly to a low resistance side.

PTL1 discloses, as reference cells, fixed resistance elements each having a slightly modified memory cell configuration and having a predetermined reference resistance value. The reference resistance value can be uniquely fixed to a desired value at the manufacturing stage. However, the resistance value distribution of the memory cell array and its absolute values may vary due to manufacturing conditions or actual operating environment. In other words, the absolute values of the distribution shown in FIG. 1 shift, relatively shifting the reference resistance value from the optimum point. This results in degradation of performance such as access time, and degradation of reliability such as data retention.

In contrast, PTL2 uses, as reference cells, memory cells having the same configuration as the memory cells in the memory cell array, allowing the variations in manufacturing conditions to be reflected in the reference cells. Furthermore, PTL2 discloses that the resistance value of each reference cell is set to the upper limit value HRmax of the HR state, and the number of reference cells connected in parallel is trimmed such that the reference resistance value is lower than or equal to HRmin.

However, this method also has difficulties in how to set the reference cell to the upper limit value HRmax of the resistance distribution of the HR state, or how to determine the lower limit value HRmin of the resistance distribution of the HR state for performing trimming so that the reference resistance value is lower than or equal to HRmin.

Although not specifically described, for example, one possible write method is a method in which the upper limit value HRmax of the resistance distribution of the HR state is assumed in advance and writing is performed so that the reference value becomes the assumed upper limit value. As in the drawbacks of PTL1, in the case where the set resistance values that are assumed in advance and the actual distribution of memory cell variations are mismatched, performance such as access time is degraded and reliability such as data retention is degraded.

The present invention has been conceived in view of such drawbacks, and has an object to provide a reference cell circuit, a method for setting the reference cell circuit, a variable resistance nonvolatile memory device which includes the reference cell circuit, and a method for controlling the variable resistance nonvolatile memory device. The reference cell circuit has a preferable configuration in which each reference cell is set to a desired one of the lower limit value LRmin and the upper limit value LRmax of the distribution range of the resistance values of the LR state and the lower limit value HRmin and the upper limit value HRmax of the distribution range of the resistance values of the HR state.

Solution to Problem

In order to solve the drawbacks, a reference cell circuit according to an aspect of the present invention includes: a first reference cell and a second reference cell each of which includes a variable resistance element which reversibly changes between a low resistance state and a high resistance state according to an application of an electric signal, the low resistance state having a resistance value within a first range, and the high resistance state having a resistance value within a second range which has a lower limit value higher than an upper limit value of the first range; a comparator which compares a resistance value of the first reference cell with a resistance value of the second reference cell; a control circuit; an application circuit which applies an electric signal to a reference cell that is one of the first reference cell and the second reference cell and that is selected by the control circuit, the electric signal being for setting the selected reference cell to a target state which is one of the low resistance state and the high resistance state; and an output circuit which electrically connects, to an output terminal, a reference cell that is one of the first reference cell and the second reference cell and that is selected by the control circuit. In the reference cell circuit, the control circuit executes a comparison operation and a write operation one or more times, to make the resistance value of the first reference cell or the resistance value of the second reference cell close to a target resistance value that is a lower limit value or an upper limit value of the target state, the comparison operation causing the comparator to perform the comparison, and the write operation causing the application circuit to apply the electric signal to a reference cell that is one of the first reference cell and the second reference cell and that has a resistance value further from the target resistance value according to each result of the comparison by the comparator, and after the write operation, the control circuit executes an output operation which causes the output circuit to electrically connect, to the output terminal, a reference cell that is one of the first reference cell and the second reference cell and that has a resistance value closer to the target resistance value according to a result of the comparison by the comparator.

Advantageous Effects of Invention

The reference cell circuit according to the present invention uses unique characteristics of the variable resistance memory elements where the resistance values of respective memory cells, which include the variable resistance elements and which are arranged in the memory cell array, have approximately the same distribution range as the resistance values of one of the memory cells which undergoes resistance changes multiple times. As a result, in a small-scale circuit which includes two reference cells, it is possible to obtain a resistance value close to any one of the upper limit value (HRmax) and the lower limit value (HRmin) of the distribution range of the resistance values of the high resistance state and the upper limit value (LRmax) and the lower limit value (LRmin) of the distribution rage of the resistance values of the low resistance state of the memory cells in the memory cell array, by a simple method in which a comparison between the resistance values of the two reference cells and a write operation to one of the reference cells corresponding to the result of the comparison are repeatedly performed.

Furthermore, according to the present invention, it is possible to indicate boundary conditions of the state in which each memory cell in the memory cell array retains information, by setting the resistance value of the reference cell to, for example, the upper limit value of the resistance distribution of the low resistance state or the lower limit value of the resistance distribution of the high resistance state. By including a read circuit which has the conditions as a reference, it is possible to provide a variable resistance nonvolatile memory device which stably operates.

Furthermore, according to the variable resistance nonvolatile memory device of the present invention, after the resistance value of the reference cell is set, for example, to boundary conditions (worst state) of the state where each memory cell in the memory cell array retains information, such as the upper limit value (LRmax) of the resistance distribution of the low resistance state or the lower limit value (HRmin) of the resistance distribution of the high resistance state, the temporal change of the resistance value of the reference cell is observed. Thus, degradation of information retention state of the reference cell can be detected prior to each memory cell and a refresh operation can be performed on the reference cell. Hence, it is possible to provide a variable resistance nonvolatile memory device with excellent data retention characteristics.

DESCRIPTION OF EMBODIMENTS

Basic Data of the Present Invention

First of all, a description is given of basic characteristics of variable resistance memory elements obtained through our research on variable resistance memories. Here, other than the drawbacks found in the disclosures of the conventional techniques, a description is given of the drawbacks newly found in a variable resistance nonvolatile memory device employing the variable resistance memory elements, in relation with the characteristics peculiar to the variable resistance memory elements.

Figure 2:
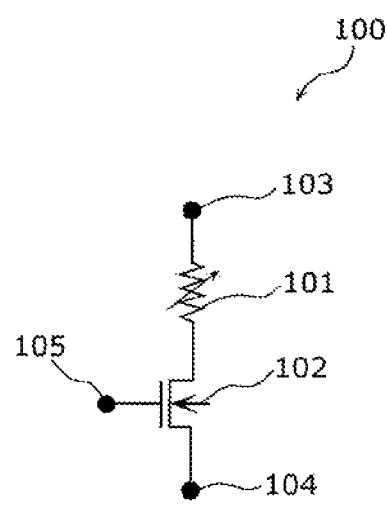
FIG. 2 is a circuit diagram of a 1T1R type memory cell as basic data of the present invention.

FIG. 2 is a circuit diagram of a memory cell used for evaluation. In a 1T1R type memory cell 100, a variable resistance memory element 101 and an NMOS transistor 102 serving as a selection element are connected in series. The memory cell 100 is capable of reversibly setting the variable resistance memory element 101 to a HR state or a LR state by controlling voltage of a terminal 103 and a terminal 104 connected to the variable resistance memory element 101 and of a terminal 105 corresponding to the gate terminal of the NMOS transistor 102.

Figure 3:
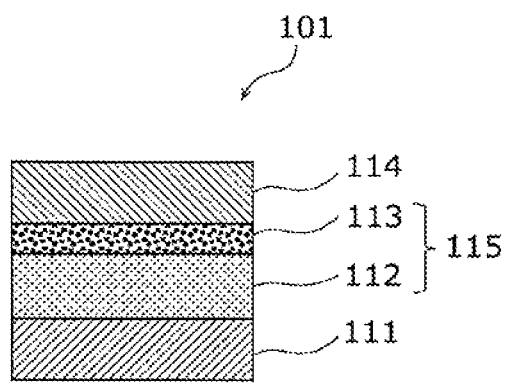
FIG. 3 schematically illustrates a basic configuration of a nonvolatile memory element as basic data of the present invention.

FIG. 3 illustrates a cross-sectional structure of the variable resistance memory element 101. The variable resistance memory element 101 includes a first electrode 111 (a lower electrode), a second electrode 114 (an upper electrode), and a variable resistance layer 115 which comprises an oxygen-deficient transition metal oxide. The variable resistance layer 115 has a stack structure of a first transition metal oxide layer 112 and a second transition metal oxide layer 113. The first transition metal oxide layer 112 comprises an oxygen-deficient transition metal oxide, and the second transition metal oxide layer 113 comprises a transition metal oxide having a degree of oxygen-deficiency smaller than that of the first transition metal oxide layer 112. In the following embodiments, the same type of transition metal is used for the first transition metal and the second transition metal, and the second tantalum oxide layer (hereinafter, referred to as a second Ta oxide layer) 113 is stacked on the oxygen-deficient first tantalum oxide layer (hereinafter, referred to as a first Ta oxide layer) 112. When the first Ta oxide layer is expressed as $TaO_x$ and the second Ta oxide layer is expressed as $TaO_y$, $x<y$ is satisfied. It is preferable that the second Ta oxide layer has a thickness ranging from 1 nm to 10 nm inclusive. Furthermore, in the following embodiments, the first electrode 111 comprises tantalum nitride (TaN), and the second electrode 114 comprises precious metal material, such as platinum (Pt).

The oxygen-deficient transition metal oxide refers to an oxide having an oxygen content (atomic ratio: a ratio of the number of oxygen atoms to the total atoms) smaller that that of an oxide having a stoichiometric composition. In general, the oxide having a stoichiometric composition includes an insulator or has a very high resistance value. For example, when the transition metal is Ta, its stoichiometric composition is expressed as $Ta_2O_5$, and the ratio of the number of O atoms to the number of Ta atoms (O/Ta) is 2.5. Thus, in the oxygen-deficient Ta oxide, the atomic ratio between O atoms and Ta atoms is larger than 0 and smaller than 2.5.

Here, the second Ta oxide layer 113 has an oxygen content atomic percentage greater than that of the first Ta oxide layer 112. In other words, the degree of oxygen deficiency of the second Ta oxide layer 113 is smaller than that of the first Ta oxide layer 112. The degree of oxygen deficiency refers to a ratio of an amount of deficient oxygen to an amount of oxygen in the oxide having a stoichiometric composition, in each transition metal. For example, when the transition metal is tantalum (Ta), the composition of the stoichiometric oxide is $Ta_2O_5$, which can be expressed as $TaO_{2.5}$. The degree of oxygen deficiency of $TaO_{2.5}$ is 0%. For example, the degree of oxygen deficiency of an oxygen-deficient tantalum oxide $TaO_{1.5}$ calculated as (2.5−1.5)/2.5=40%. Furthermore, the oxygen content atomic percentage refers to a ratio of the number of the oxygen atoms to the total atoms in the transition metal oxide. The oxygen content atomic percentage of $Ta_2O_5$ is calculated by a ratio of the number of O atoms to the number of the total atoms (O/(Ta+O)), and is 71.4 atm %. Therefore, the oxygen-deficient tantalum oxide has an oxygen content atomic percentage greater than 0 and smaller than 71.4 atm %.

A transition metal other than tantalum may be used as a metal comprised in the variable resistance layer 115. Examples of the transition metal include tantalum (Ta), titanium (Ti), hafnium (Hf), zirconium (Zr), niobium (Nb), and tungsten (W). The transition metal can be a plurality of kinds of oxide, and thus can achieve different resistance states through oxidation-reduction reaction. For example, in the case of hafnium oxide, it is verified that the resistance value of the variable resistance layer 115 can be stably changed at high speed, when the composition of the first hafnium oxide layer 112 is expressed as $HfO_x$ where x is between 0.9 and 1.6 inclusive, and the composition of the second hafnium oxide layer 113 is expressed as $HfO_y$ where y is greater than x. In this case, it is preferable that the second hafnium oxide layer 113 has a thickness ranging from 3 nm to 4 nm inclusive. Furthermore, in the case of zirconium oxide, it is verified that the resistance value of the variable resistance layer 115 can be stably changed at high speed when a composition of the first zirconium oxide layer 112 is expressed as $ZrO_x$, where x is between 0.9 and 1.4 inclusive, and a composition of the second zirconium oxide layer 113 is expressed as $ZrO_y$ where y is greater than x. In this case, it is preferable that the second zirconium oxide layer 113 has a thickness ranging from 1 nm to 5 nm inclusive.

In the above examples, the variable resistance layer has a double-layered structure; however, the variable resistance layer may be a single oxygen-deficient transition metal oxide layer.

Furthermore, the variable resistance layer 115 may have a stack structure including the first transition metal oxide layer 112 comprising a first transition metal and the second transition metal oxide layer 113 comprising a second transition metal different from the first transition metal. The degree of oxygen deficiency of the second transition metal oxide layer is smaller than that of the first transition metal oxide layer. In other words, the second transition metal oxide layer 113 has a resistance value greater than that of the first transition metal oxide layer 112. With such a structure, a voltage applied between the first electrode 111 and the second electrode 114 at the time of a resistance change is distributed more to the second transition metal oxide layer 113. As a result, oxidation-reduction reaction easily occurs in the second transition metal oxide layer 113.

Moreover, when the first transition metal is different from the second transition metal in material, it is preferable that a standard electrode potential of the second transition metal be lower than that of the first transition metal. When oxidation-reduction reaction occurs in a refined filament (conducting path) formed in the second transition metal oxide layer 113 having a high resistance, the resistance value of the second transition metal oxide layer 113 changes. It is considered that this causes the resistance changing phenomenon. For example, if the first transition metal oxide layer 112 comprises an oxygen-deficient tantalum oxide and the second transition metal oxide layer 113 comprises a titanium oxide ($TiO_2$), it is possible to achieve stable resistance changing. Titanium (with a standard electrode potential=−1.63 eV) is a material having a standard electrode potential lower than that of tantalum (with a standard electrode potential=−0.6 eV). Using, for the second transition metal oxide layer 113, a metal oxide having a standard electrode potential lower than that of the first transition metal oxide layer 112 allows the oxidation-reduction reaction to more easily occur in the second transition metal oxide layer 113.

With any of the above-described materials, the resistance changing phenomenon in the variable resistance layer having the stack structure is considered to occur when oxidation-reduction reaction occurs in a refined filament generated in the high-resistance second transition metal oxide layer 113 and the resistance value of the second transition metal oxide layer 113 changes. More specifically, when a positive voltage is applied to the second electrode 114 closer to the second transition metal oxide layer 113 with reference to the first electrode 111, oxidation reaction occurs in a refined filament generated in the second transition metal oxide layer 113 when oxygen ions in the variable resistance layer 115 are attracted towards the second transition metal oxide layer 113. It is considered that this increases the resistance of the refined filament. On the other hand, when a negative voltage is applied to the second electrode 114 closer to the second transition metal oxide layer 113 with reference to the first electrode 111, oxygen ions in the second transition metal oxide layer 113 are pushed towards the first transition metal oxide layer 112, and then reduction reaction occurs in a refined filament generated in the second transition metal oxide layer 113. It is considered that this decreases the resistance of the refined filament.

The second electrode 114, connected to the second transition metal oxide layer 113 having a smaller degree of oxygen deficiency, comprises a material, such as platinum (Pt), iridium (Ir), or palladium (Pd), which has a standard electrode potential higher than that of the transition metal comprised in the second transition metal oxide layer 113 and the material comprised in the first electrode 111. With the above structure, oxidation-reduction reaction occurs selectively in a part of the second transition metal oxide layer 113 which is close to the interface between the second electrode 114 and the second transition metal oxide layer 113, and stable resistance changing phenomenon can be achieved.

Figure 4:
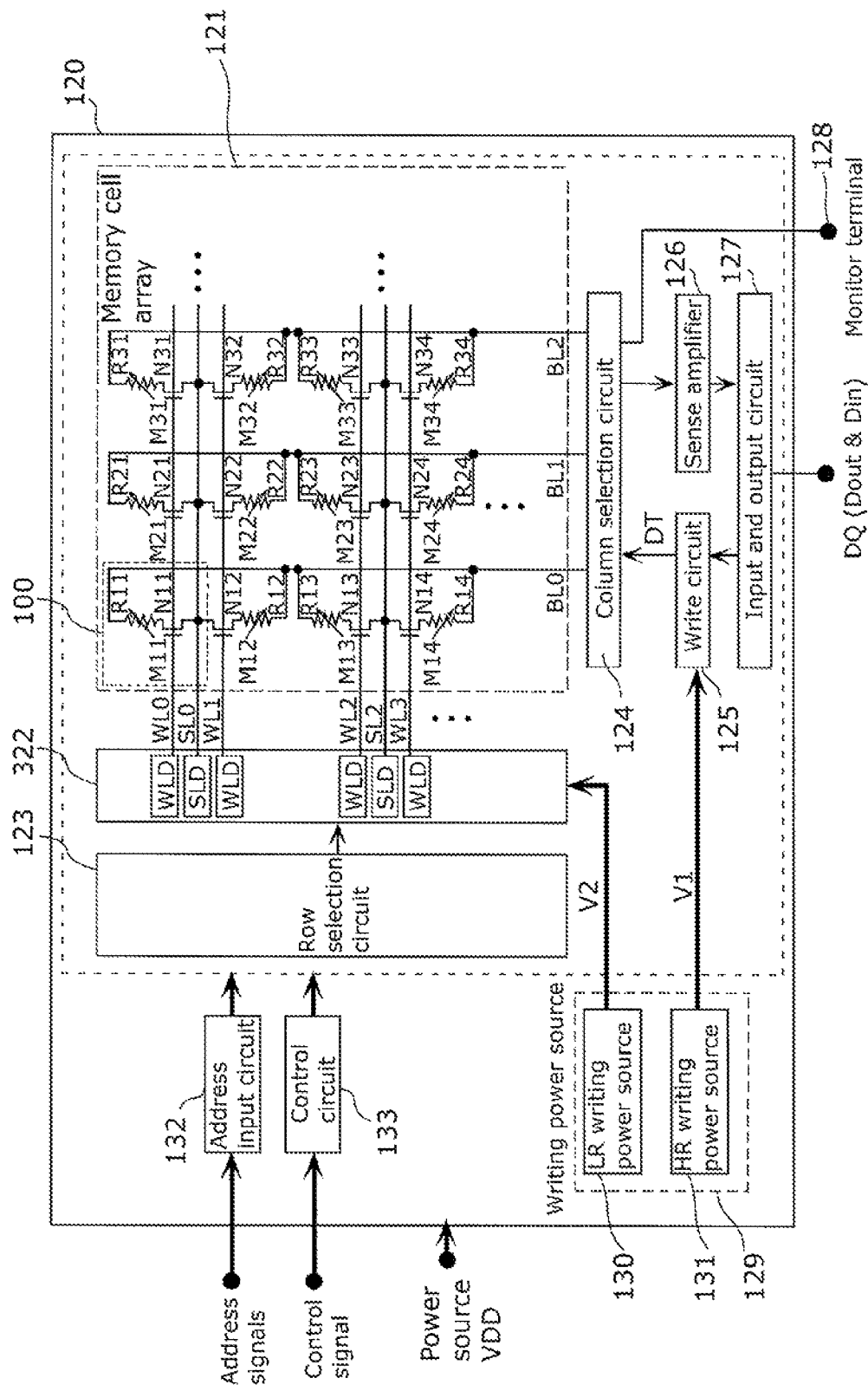
FIG. 4 is a configuration diagram of a variable resistance nonvolatile memory device used for measuring the basic data of the present invention.

FIG. 4 is a block diagram of a variable resistance nonvolatile memory device 120 used for the evaluation of the memory cell 100.

As shown in FIG. 4, the variable resistance nonvolatile memory device 120 includes, on a substrate, a memory cell array 121, a row selection circuit 123, a row driver 122 including word line drivers WLD and source line drivers SLD, a column selection circuit 124, a write circuit 125 which writes data, a read circuit 126 which detects an amount of current flowing through a selected bit line and determines whether the stored data is "1" or "0", and an input and output circuit 127 which receives and outputs data via a terminal DQ. The variable resistance nonvolatile memory device 120 also includes a monitor terminal 128 via the column selection circuit 124 for directly measuring an amount of current flowing through a selected bit line.

Furthermore, the variable resistance nonvolatile memory device 120 includes, as a writing power source 129, a LR (low resistance) writing power source 130 and a HR (high resistance) writing power source 131. An output V2 of the LR writing power source 130 is provided to the row driver 122, while an output V1 of the HR writing power source 131 is provided to the write circuit 125.

The variable resistance nonvolatile memory device 120 further includes: an address input circuit 132 which receives address signals provided from the outside; and a control circuit 133 which performs control based on control signals provided from the outside.

Next, a description is given of a result of measurement of characteristics of the memory cell 100 measured by using the variable resistance nonvolatile memory device 120.

In this measurement, HR (high resistance) writing and measurement of memory cell current were performed on the memory cells of 1024-bit address space from the initial address, and then LR (low resistance) writing and measurement of memory cell current were performed on the same address space. This sequence was repeated 100 times.

The writing power source 129 and a power source VDD were set such that a voltage of 1.8 V was applied to a terminal 103, and a voltage of 0 V was applied to a terminal 104, and a voltage of 2.4 V was applied to a terminal 105 of the memory cell 100 in the HR write operation, and that a voltage of 0 V was applied to a terminal 103, a voltage of 2.4 V was applied to the terminal 104, and a voltage of 2.4 V was applied to the terminal 105 of the memory cell 100 in the LR write operation. In the measurement of the memory cell current, the power source VDD was set such that a voltage of 0 V was applied to the terminal 104, and a voltage of 1.8 V was applied to the terminal 105 of the memory cell 100, and a voltage of 0.4 V (which does not cause resistance change) was applied to the monitor terminal 128. In this way, the value of the current flowing from the terminal 103 to the terminal 104 of the memory cell 100 was measured as a memory cell current value.

Figure 5A:
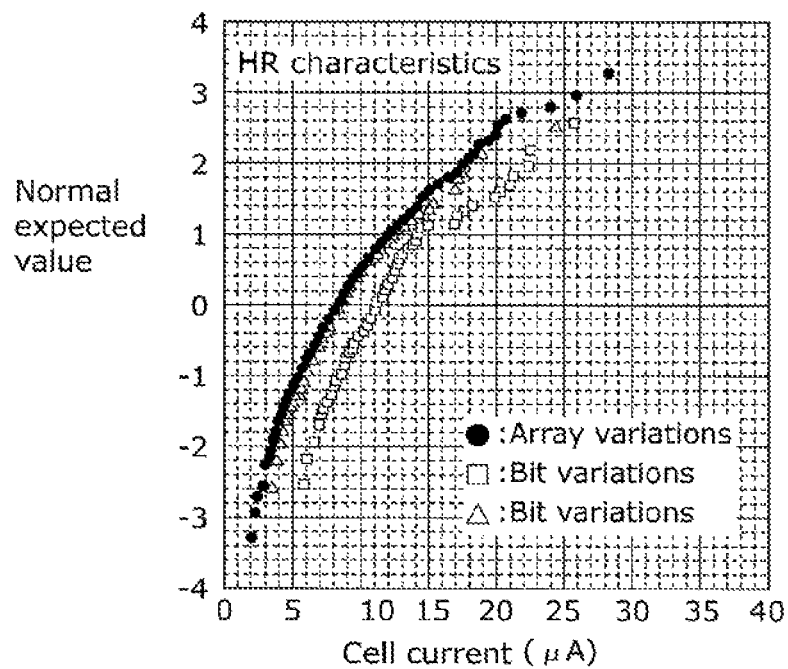
FIG. 5A illustrates an example of the distribution of memory cell current in a high resistance state in a resistance change of the nonvolatile memory element as basic data of the present invention.

FIG. 5A shows the distribution of memory cell current values after the HR writing.

The black dots indicate, in a Weibull plot, the distribution of the memory cell current values of 1024-bit memory cells after the 100th HR writing (hereinafter, the distribution of the current values of the memory cells in the memory cell array after the HR writing is referred to as HR array variations).

The white squares and triangles indicate, in a normal expected value plot, the memory cell current values of the memory cells corresponding to two specific bits in 1024 bits (here, the 0th bit and the first bit as an example) after each first to 100th HR writing (hereinafter, when HR writing is performed on one memory cell multiple times, the distribution of the current values of the memory cell after each HR writing is referred to as HR bit variations).

Figure 5B:
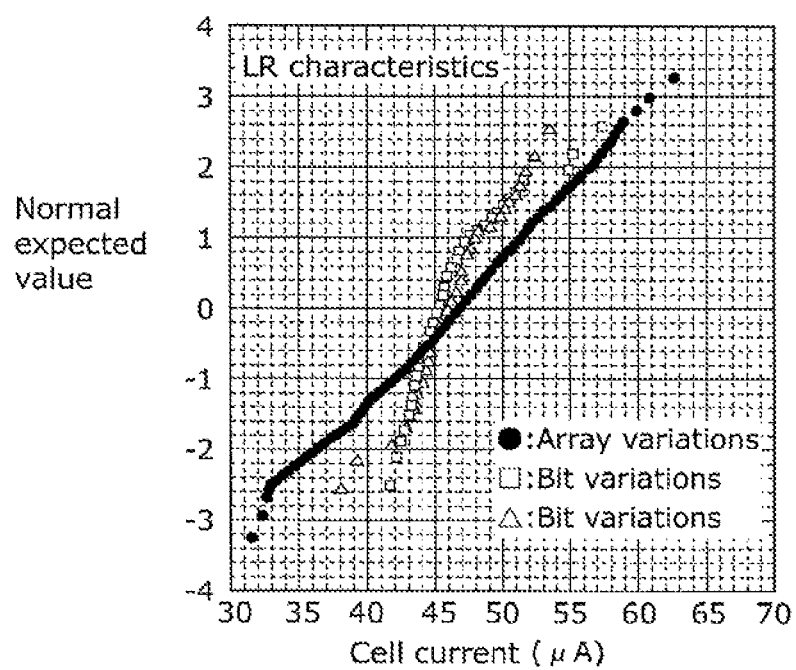
FIG. 5B illustrates an example of the distribution of memory cell current in a low resistance state in a resistance change of the nonvolatile memory element as basic data of the present invention.

FIG. 5B shows the distribution of memory cell current values after the LR writing.

The black dots indicate, in the Weibull plot, the distribution of the memory cell current values of 1024-bit memory cells after the 100th LR writing (hereinafter, the distribution of the current values of the memory cells in the memory cell array after the LR writing is referred to as LR array variations).

The white squares and triangles indicate, in the Weibull plot, bit variations of the current values of the memory cells corresponding to two specific bits in 1024 bits (here, 2 bits near the scale 0 of the vertical axis in the array variations as an example) after each first to 100th LR writing.

In FIG. 5A, the HR array variations are almost normally distributed from 2 μA to 28 μA. The HR bit variations of each of 2-bit memory cells indicated as an example are also in the approximately same range, showing the normal distribution similar to that of the HR array variations.

In FIG. 5B, the LR array variations are also almost normally distributed from 31 μA to 63 μA. The LR bit variations of each of 2-bit memory cells indicated as an example also have a normal distribution although in a narrower range.

In other words, the array variations and the bit variations are normally distributed in the almost same range. In each resistance change operation, the resistance value of the same memory cell of the HR state or the LR state also normally distributes from the lower limit value to the upper limit value of each state. The array variations have characteristics where a collection of memory cells reflect the bit variations and have approximately the same normal distribution.

This indicates that observing the variations of the 1-bit memory cell which underwent resistance changes multiple times allows rough prediction of the array variations of the memory cell array including memory cells each having the same configuration as the 1-bit memory cell.

This phenomenon is different from the known mechanism of the variations of memories such as a DRAM or a flash memory.

The variations of these memories are the variations the respective memory cells have, even on a signal chip, depending on some kind of physical parameters, such as a memory cell having a memory node whose feature size is relatively small or relatively large, or a memory cell having a memory node that is relatively thin or thick.

Thus, when a memory cell has a physical amount corresponding to the stored information (for example, the amount of stored charge in the case of DRAM, and the writing threshold voltage in the case of flash memory) that is small, the physical amount distributes in the range of low levels even after repeated writing. When a memory cell has a physical amount that is large, the physical amount distributes in the range of high levels even after repeated writing. As a statistical result of such memory cells, array variations exist.

A principle of the present invention uses the characteristics of the variable resistance memory element where even one memory cell has a physical amount (resistance value) which corresponds to the stored information and which has a normal distribution between a lower value and a higher value each time the write operation is performed.

A reference cell circuit according to an aspect of the present invention includes: a first reference cell and a second reference cell each of which includes a variable resistance element which reversibly changes between a low resistance state and a high resistance state according to an application of an electric signal, the low resistance state having a resistance value within a first range, and the high resistance state having a resistance value within a second range which has a lower limit value higher than an upper limit value of the first range; a comparator which compares a resistance value of the first reference cell with a resistance value of the second reference cell; a control circuit; an application circuit which applies an electric signal to a reference cell that is one of the first reference cell and the second reference cell and that is selected by the control circuit, the electric signal being for setting the selected reference cell to a target state which is one of the low resistance state and the high resistance state; and an output circuit which electrically connects, to an output terminal, a reference cell that is one of the first reference cell and the second reference cell and that is selected by the control circuit. In the reference cell circuit, the control circuit executes a comparison operation and a write operation one or more times, to make the resistance value of the first reference cell or the resistance value of the second reference cell close to a target resistance value that is a lower limit value or an upper limit value of the target state, the comparison operation causing the comparator to perform the comparison, and the write operation causing the application circuit to apply the electric signal to a reference cell that is one of the first reference cell and the second reference cell and that has a resistance value further from the target resistance value according to each result of the comparison by the comparator, and after the write operation, the control circuit executes an output operation which causes the output circuit to electrically connect, to the output terminal, a reference cell that is one of the first reference cell and the second reference cell and that has a resistance value closer to the target resistance value according to a result of the comparison by the comparator.

Such a configuration uses unique characteristics of the variable resistance memory elements where the resistance values of respective memory cells, which include the variable resistance elements and which are arranged in the memory cell array, have approximately the same distribution range as the resistance values of one of the memory cells which undergoes resistance changes multiple times. As a result, in a small-scale circuit which includes two reference cells, it is possible to obtain a resistance value close to the target resistance value that is any one of the upper limit value (HRmax) and the lower limit value (HRmin) of the distribution range of the resistance values of the high resistance state and the upper limit value (LRmax) and the lower limit value (LRmin) of the distribution range of the resistance values of the low resistance state of the memory cells in the memory cell array, by a simple method in which a comparison between the resistance values of the two reference cells and a write operation to one of the reference cells corresponding to the result of the comparison are repeatedly performed.

The reference cell circuit may further include a pulse generation circuit which generates the electric signal.

With this configuration, the pulse generation circuit is capable of generating the electrical signal used for the write operation.

It may also be that the application circuit applies, as the electric signal, a first pulse signal and a second pulse signal to the reference cell selected by the control circuit, the first pulse signal being for setting the first reference cell and the second reference cell to one of the low resistance state and the high resistance state which is different from the target state, and the second pulse signal being applied after the first pulse signal for setting the first reference cell and the second reference cell to the target state.

With this configuration, by setting the first reference cell and the second reference cell to the target state and the resistance state different from the target state, it is possible to obtain the resistance value close to the target resistance value.

It may also be that each of the first reference cell and the second reference cell includes the variable resistance element and a transistor connected in series (so-called a 1T1R type cell).

With this configuration, it is possible to obtain a reference cell circuit suitably used in combination with the 1T1R type memory cell array.

It may also be that each of the first reference cell and the second reference cell includes the variable resistance element and a diode connected in series (so-called a 1D1R type cell).

With this configuration, it is possible to obtain a reference cell circuit suitably used in combination with the 1D1R type memory cell array having a crosspoint structure.

It may also be that the variable resistance element comprises tantalum oxide.

With this configuration, the first reference cell and the second reference cell may comprise tantalum oxide which is one example of a variable resistance material that easily obtains preferable resistance change characteristics.

It may also be that to make the resistance value of the first reference cell or the resistance value of the second reference cell close to an upper limit value of the low resistance state, the control circuit causes, for each write operation, the application circuit to apply, to one of the first reference cell and the second reference cell determined by the comparator to have a lower resistance value, an electric signal for setting the determined one of the first reference cell and the second reference cell to the low resistance state, and in the output operation, the control circuit causes the output circuit to electrically connect, to the output terminal, one of the first reference cell and the second reference cell determined by the comparator to have a higher resistance value.

In this case, the reference cell set to LRmax that is the upper limit value of the resistance distribution of the low resistance state is connected to the output terminal.

It may also be that to make the resistance value of the first reference cell or the resistance value of the second reference cell close to a lower limit value of the low resistance state, the control circuit causes, for each write operation, the application circuit to apply, to one of the first reference cell and the second reference cell determined by the comparator to have a higher resistance value, an electric signal for setting the determined one of the first reference cell and the second reference cell to the low resistance state, and in the output operation, the control circuit causes the output circuit to electrically connect, to the output terminal, one of the first reference cell and the second reference cell determined by the comparator to have a lower resistance value.

In this case, the reference cell set to LRmin that is the lower limit value of the resistance distribution of the low resistance state is connected to the output terminal.

It may also be that to make the resistance value of the first reference cell or the resistance value of the second reference cell close to an upper limit value of the high resistance state, the control circuit causes, for each write operation, the application circuit to apply, to one of the first reference cell and the second reference cell determined by the comparator to have a lower resistance value, an electric signal for setting the determined one of the first reference cell and the second reference cell to the high resistance state, and in the output operation, the control circuit causes the output circuit to electrically connect, to the output terminal, one of the first reference cell and the second reference cell determined by the comparator to have a higher resistance value.

In this case, the reference cell set to HRmax that is the upper limit value of the resistance distribution of the high resistance state is connected to the output terminal.

It may also be that to make the resistance value of the first reference cell or the resistance value of the second reference cell close to a lower limit value of the high resistance state, the control circuit causes, for each write operation, the application circuit to apply, to one of the first reference cell and the second reference cell determined by the comparator to have a higher resistance value, an electric signal for setting the determined one of the first reference cell and the second reference cell to the high resistance state, and in the output operation, the control circuit causes the output circuit to electrically connect, to the output terminal, one of the first reference cell and the second reference cell determined by the comparator to have a lower resistance value.

In this case, the reference cell set to HRmin that is the lower limit value of the resistance distribution of the high resistance state is connected to the output terminal.

With these configurations, it is possible to set the reference cell to a desired one of the upper limit value (HRmax) and the lower limit value (HRmin) of the resistance distribution of the high resistance state and the upper limit value (LRmax) and the lower limit value (LRmin) of the resistance distribution of the low resistance state.

It may also be that the reference cell circuit further includes an other set of the first reference cell, the second reference cell, the comparator, the application circuit, and the output circuit, in which the control circuit executes the write operation and the output operation one or more times for each set, and the reference cell circuit further includes: a second comparator which compares the resistance values of the reference cells connected to the output terminals of the respective sets; and a second output circuit which connects, to an output terminal, one of the reference cells connected to the output terminals of the respective sets according to a result of the comparison by the second comparator.

With this configuration, appropriate control is performed when two or more reference cells are used for setting desired resistance values.

A variable resistance memory device according to an aspect of the present invention includes: a memory cell array which includes a plurality of memory cells arranged in rows and columns, each of the memory cells including a variable resistance element which reversibly changes between a low resistance state and a high resistance state according to an application of an electric signal, the low resistance state having a resistance value within a first range, the high resistance state having a resistance value within a second range which has a lower limit value higher than an upper limit value of the first range; a reference circuit which includes at least one reference cell circuit according to any one of claim 1 to claim 10, and generates a reference level for determining a resistance state of each of the memory cells with reference to a resistance value of a reference cell connected to an output terminal of the at least one reference cell circuit; and a read circuit which determines whether each memory cell is in the low resistance state or in the high resistance state by comparing a signal level obtained from the memory cell with the reference level generated by the reference circuit. In the variable resistance memory device, each of the at least one reference cell circuit includes: a first reference cell and a second reference cell each of which includes a variable resistance element which reversibly changes between the low resistance state and the high resistance state according to an application of an electric signal; a comparator which compares a resistance value of the first reference cell with a resistance value of the second reference cell: a control circuit; an application circuit which applies an electric signal to a reference cell that is one of the first reference cell and the second reference cell and that is selected by the control circuit, the electric signal being for setting the selected reference cell to a target state which is one of the low resistance state and the high resistance state; and an output circuit which electrically connects, to an output terminal, a reference cell that is one of the first reference cell and the second reference cell and that is selected by the control circuit, in which the control circuit executes a comparison operation and a write operation one or more times, to make the resistance value of the first reference cell or the resistance value of the second reference cell close to a target resistance value that is a lower limit value or an upper limit value of the target state, the comparison operation causing the comparator to perform the comparison, and the write operation causing the application circuit to apply the electric signal to a reference cell that is one of the first reference cell and the second reference cell and that has a resistance value further from the target resistance value according to each result of the comparison by the comparator, and after the write operation, the control circuit executes an output operation which causes the output circuit to electrically connect, to the output terminal, a reference cell that is one of the first reference cell and the second reference cell and that has a resistance value closer to the target resistance value according to a result of the comparison by the comparator.

With this configuration, by setting the resistance value of the reference cell to, for example, the upper limit value (LRmax) of the resistance distribution of the low resistance state or the lower limit value (HRmin) of the resistance distribution of the high resistance state, it is possible to indicate boundary conditions of the state where each memory cell in the memory cell array retain information. By including a read circuit which has the conditions as a reference, it is possible to provide a variable resistance nonvolatile memory device which stably operates.

A variable resistance memory device according to an aspect of the present invention includes: a memory cell array including a plurality of memory cells arranged in rows and columns, each of the memory cells including a variable resistance element which reversibly changes between a low resistance (LR) state and a high resistance (HR) state according to an application of an electric signal, the low resistance state having a resistance value within a first range (LRmin or higher and LRmax or lower), the high resistance state having a resistance value within a second range (HRmin or higher and HRmax or lower) which has a lower limit value (HRmin) higher than an upper limit value (LRmax) of the first range; a refresh command circuit which includes a reference cell circuit, and outputs a refresh command signal when a resistance value of a reference cell connected to an output terminal of the reference cell circuit becomes a predetermined value; and a control circuit which performs a read operation and then a refresh operation on at least a part of the memory cells in the memory cell array when the refresh command signal is output, the read operation being for reading data from the part of the memory cells, and the refresh operation being for rewriting the read data to the part of the memory cells. The reference cell circuit includes: a first reference cell and a second reference cell each of which includes a variable resistance element which reversibly changes between the low resistance state and the high resistance state according to an application of an electric signal; a comparator which compares a resistance value of the first reference cell with a resistance value of the second reference cell; a control circuit: an application circuit which applies an electric signal to a reference cell that is one of the first reference cell and the second reference cell and that is selected by the control circuit, the electric signal being for setting the selected reference cell to a target state which is one of the low resistance state and the high resistance state; and an output circuit which electrically connects, to an output terminal, a reference cell that is one of the first reference cell and the second reference cell and that is selected by the control circuit, in which the control circuit executes a comparison operation and a write operation one or more times, to make the resistance value of the first reference cell or the resistance value of the second reference cell close to a target resistance value that is a lower limit value or an upper limit value of the target state, the comparison operation causing the comparator to perform the comparison, and the write operation causing the application circuit to apply the electric signal to a reference cell that is one of the first reference cell and the second reference cell and that has a resistance value further from the target resistance value according to each result of the comparison by the comparator, and after the write operation, the control circuit executes an output operation which causes the output circuit to electrically connect, to the output terminal, a reference cell that is one of the first reference cell and the second reference cell and that has a resistance value closer to the target resistance value according to a result of the comparison by the comparator.

According to this configuration, after the resistance value of the reference cell is set, for example, to boundary conditions (worst state) of the state where each memory cell in the memory cell array retains information, such as the upper limit value (LRmax) of the resistance distribution of the low resistance state or the lower limit value (HRmin) of the resistance distribution of the high resistance state, the temporal change of the resistance value of the reference cell is observed. Thus, degradation of information retention state of the reference cell can be detected prior to each memory cell and a refresh operation can be performed on the reference cell. Hence, it is possible to provide a variable resistance nonvolatile memory device having excellent data retention characteristics.

It may also be that at a manufacturing process of the variable resistance nonvolatile memory device, the reference cell circuit executes the write operation one or more times, and causes the output circuit to electrically connect, to the output terminal, one of the first reference cell and the second reference cell corresponding to the result of the comparison by the comparator.

With this configuration, at the manufacturing process of the variable resistance nonvolatile memory device, it is possible to obtain a resistance value close to any one of the upper limit value and the lower limit value of the distribution range of the resistance values of the high resistance state and the upper limit value and the lower limit value of the distribution range of the resistance values of the low resistance state of the memory cells in the memory cell array.

It may also be that while the variable resistance nonvolatile memory device is in a standby state or an idle state, the reference cell circuit causes the application circuit to perform the write operation one or more times, and causes the output circuit to electrically connect, to the output terminal, one of the first reference cell and the second reference cell corresponding to the result of the comparison by the comparator.

With this configuration, while the variable resistance nonvolatile memory device is in a standby state or an idle state, it is possible to obtain a resistance value close to any one of the upper limit value and the lower limit value of the distribution range of the resistance values of the high resistance state and the upper limit value and the lower limit value of the distribution range of the resistance values of the low resistance state of the memory cells in the memory cell array.

It may also be that when the refresh command signal is output, the reference cell circuit executes the write operation one or more times, and causes the output circuit to electrically connect, to the output terminal, one of the first reference cell and the second reference cell corresponding to the result of the comparison by the comparator.

With this configuration, according to the refresh command, it is possible to obtain a resistance value close to any one of the upper limit value and the lower limit value of the distribution range of the resistance values of the high resistance state and the upper limit value and the lower limit value of the distribution range of the resistance values of the low resistance state of the memory cells in the memory cell array.

A method for setting a reference cell circuit according to an aspect of the present invention is a method for setting a reference cell circuit including a first reference cell and a second reference cell each of which includes a variable resistance element which reversibly changes between a low resistance state and a high resistance state according to an application of an electric signal, the low resistance state having a resistance value within a first range, the high resistance state having a resistance value within a second range which has a lower limit value higher than an upper limit value of the first range. The method includes: applying an electric signal one or more times to a reference cell that is one of the first reference cell and the second reference cell and that has a resistance value further from a target resistance value according to each result of a comparison between a resistance value of the first reference cell and a resistance value of the second reference cell, to make the resistance value of the first reference cell or the resistance value of the second reference cell close to the target resistance value, the target resistance value being a lower limit value or an upper limit value of a target state that is one of the low resistance state and the high resistance state, and the electric signal being for setting the reference cell to the target state; and after the applying, electrically connecting, to an output terminal, one of the first reference cell and the second reference cell which has a resistance value closer to the target resistance value according to a result of a comparison between the resistance value of the first reference cell and the resistance value of the second reference cell.

According to the method, the same advantageous effects as those described above can be obtained in setting of the reference cell circuit.

These general and specific aspects may be implemented using a system, a method, an integrated circuit, a computer program, or a recording medium, or any combination of systems, methods, integrated circuits, computer programs, or recording media.

Hereinafter, certain exemplary embodiments of the present invention using the variable resistance memory elements are described with reference to the accompanying Drawings.

Embodiment 1

Figure 6:
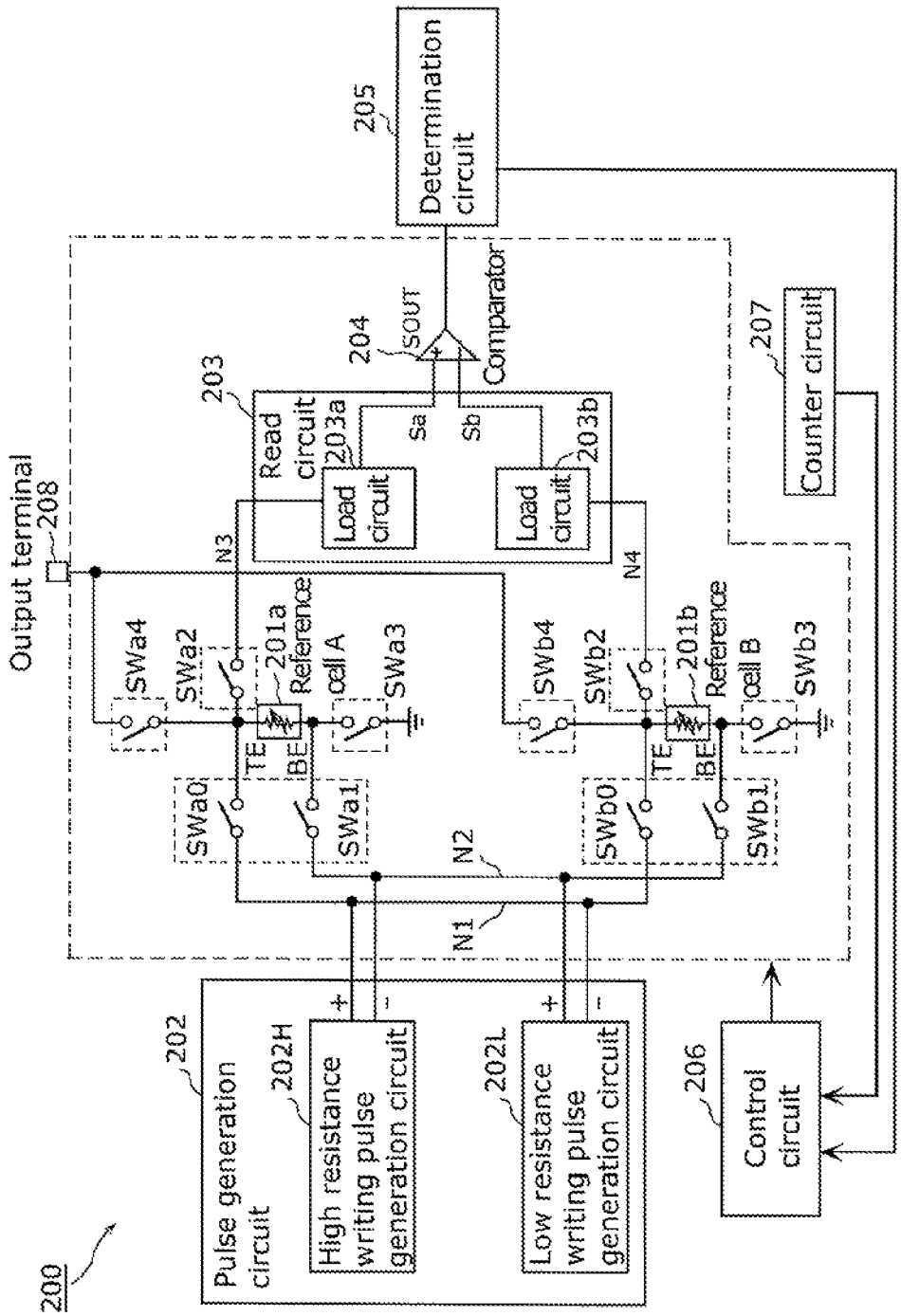
FIG. 6 is a configuration diagram of a reference cell circuit according to Embodiments of the present invention.

FIG. 6 is a configuration diagram illustrating an example of a reference cell circuit 200 according to Embodiment 1 of the present invention.

Figure 1:
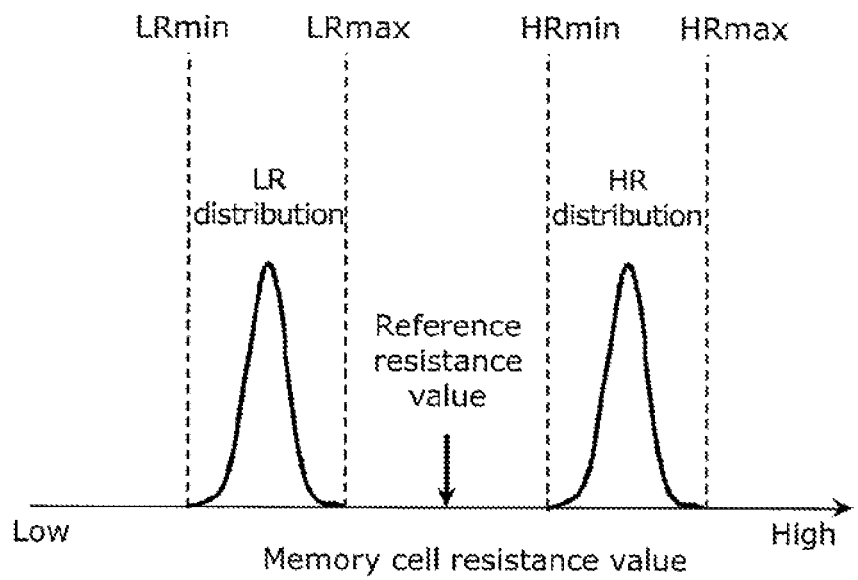
FIG. 1 is a schematic chart of resistance value distribution of a memory cell array.

The reference cell circuit 200 includes two reference cells A and B, and generates, for one of the reference cells A and B, a resistance value close to any one of LRmin, LRmax, HRmin, and HRmax in the array variations shown in FIG. 1.

The reference cell circuit 200 includes: (a) a reference cell A (201*a*) and a reference cell B (201*b*), each of which includes the variable resistance element 101 shown in FIG. 2 and which have the same configuration; (b) a pulse generation circuit 202 which includes a HR (high resistance) writing pulse generation circuit 202H for generating pulse signals for changing the resistance state of the reference cells 201a and 201b to a high resistance state and a LR resistance) writing pulse generation circuit 202L for generating pulse signals for changing the resistance state of the reference cells 201a and 201b to a low resistance state; (c) a read circuit 203 which includes load circuits 203a and 203b for reading the resistance values of the reference cells 201a and 201b respectively; (d) a comparator 204 which compares the resistance value of the reference cell 201a with the resistance value of the reference cell 201b; (e) a determination circuit 205 which determines the next operation to be performed according to the result of the comparison by the comparator 204; (f) a control circuit 206 which controls the operations of respective blocks according to the result of the determination by the determination circuit 205; (g) a counter circuit 207 which counts the number of write operations; (h) an output terminal 208; and (i) switches SWa0, SWb0, SWa1, SWb1, SWa2, SWb2, SWa3, SWb3, SWa4, and SWb4.

Each of the switches SWa0, SWb0, SWa1, SWb1, SWa2, SWb2, SWa3, SWb3, SWa4, and SWb4 electrically connects or disconnects a predetermined block section including the output terminal 208, according to a control signal from the control circuit 206.

Here, each of the reference cells 201a and 201b has terminals TE and BE respectively connected to a second terminal 114 and a first terminal 111 of the variable resistance memory element 101.

When a positive voltage pulse equal to or higher than a predetermined level is applied to the electrode TE with reference to the electrode BE, the variable resistance memory elements 101 included in the reference cells 201a and 201b are changed to a high resistance state. When a positive voltage pulse equal to or higher than a predetermined level is applied to the electrode BE with reference to the electrode TE, the variable resistance memory elements 101 included in the reference cells 201a and 201b are changed to a low resistance state.

It may be that a transistor or a diode is connected in series between the terminal TE and the second electrode 114, or between the terminal BE and the first electrode 111.

The HR writing pulse generation circuit 202H has a plus terminal which generates a positive voltage pulse relative to a minus terminal. The minus terminal is connected to a node N2, and the plus terminal is connected to a node N1.

The LR writing pulse generation circuit 202L has a plus terminal which generates a positive voltage pulse relative to a minus terminal. The minus terminal is connected to the node N1, and the plus terminal is connected to the node N2.

The TE terminal of the reference cell 201a is connected to the node N1, a node N3, and the output terminal 208 via the switches SWa0, SWa2, and SWa4. The BE terminal of the reference cell 201a is connected to the node N2 and ground (ground potential) via the switches SWa1 and SWa3.

The TE terminal of the reference cell 201b is connected to the node N1, the node N4, and the output terminal 208 via the switches SWb0, SWb2, and SWb4. The BE terminal of the reference cell 201b is connected to the node N2 and ground via the switches SWb1 and SWb3.

Although a detailed description of the operations will be described later, each switch turns on and off according to a control signal (not shown) provided from the control circuit 206 based on the result of the determination by the determination circuit 205.

In the reference cell circuit 200 having such a configuration, the switches SWa0, SWa1, SWb0, and SWb1 are an example of an application circuit, and the switches SWa3, SWa4, SWb3, and SWb4 are an example of an output circuit.

Figure 7:
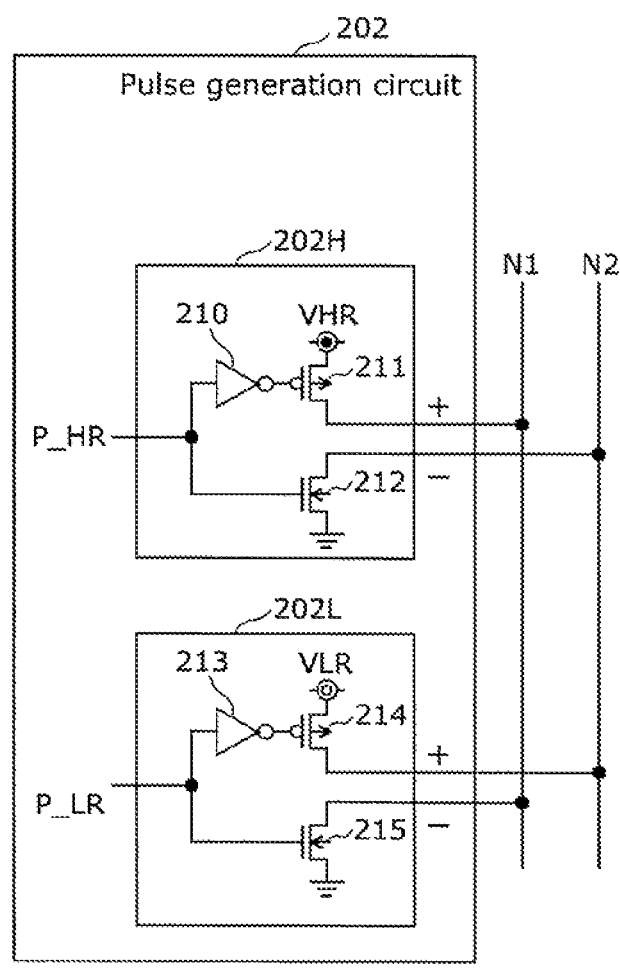
FIG. 7 is a configuration diagram of a pulse generation circuit in the reference cell circuit according to Embodiments of the present invention.

FIG. 7 is a circuit diagram illustrating a specific example of the pulse generation circuit 202.

The HR writing pulse generation circuit 202H includes: an inverter 210 which receives an input of a high resistance writing pulse command signal P_HR; a PMOS transistor 211; and a NMOS transistor 212. The PMOS transistor 211 has a gate provided with an output of the inverter 210, one of source and drain terminals connected to the high resistance writing power source VHR, and the other one of the source and drain terminals connected to the node N1. The NMOS transistor 212 has a gate provided with the high resistance writing pulse command signal P_HR, one of source and drain terminals connected to ground, and the other one of the source and drain terminals connected to the node N2.

The LR writing pulse generation circuit 202L includes: an inverter 213 which receives an input of a low resistance writing pulse command signal P_LR; a PMOS transistor 214; and a NMOS transistor 215. The PMOS transistor 214 has a gate provided with an output of the inverter 213, one of source and drain terminals connected to the low resistance writing power source VLR, and the other one of the source and drain terminals connected to the node N2. The NMOS transistor 215 has a gate provided with the low resistance writing pulse command signal P_LR, one of source and drain terminals connected to ground, and the other one of the source and drain terminals connected to the node N1.

Figure 8:
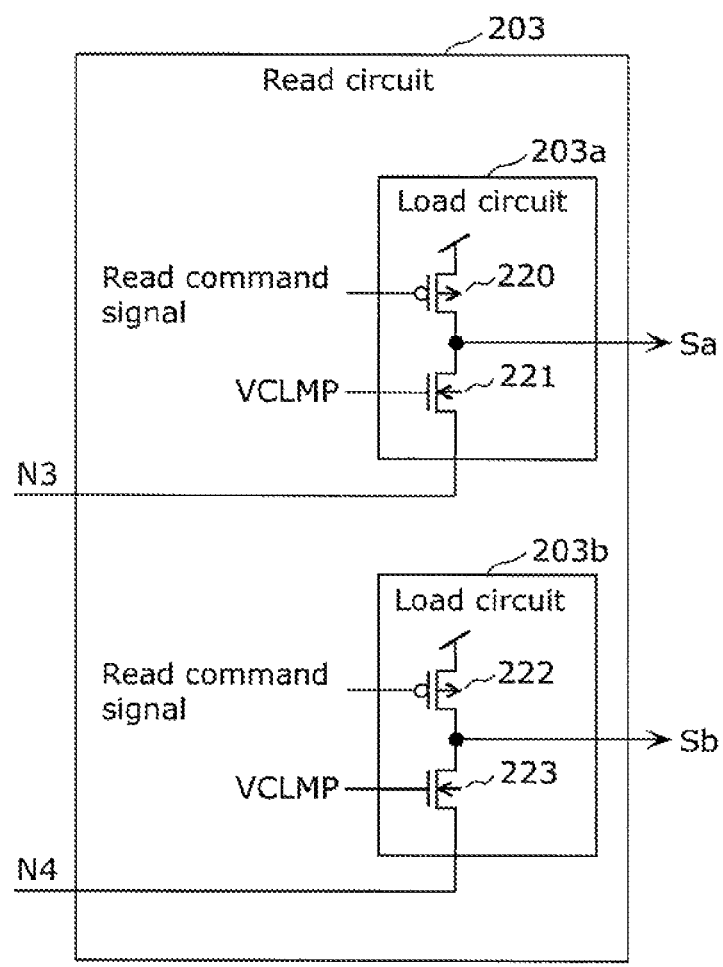
FIG. 8 is a configuration diagram of a read circuit in the reference cell circuit according to Embodiments of the present invention.

FIG. 8 is a circuit diagram illustrating a specific example of the read circuit 203.

The load circuit 203a includes a PMOS transistor 220 and a NMOS transistor 221. The PMOS transistor 220 has a gate provided with a read command signal (a signal provided from the control circuit 206), one of source and drain terminals which is connected to a power source voltage, and the other one of the source and drain terminals which is connected to a node Sa. The NMOS transistor 221 has a gate connected to a predetermined voltage source VCLMP, one of source and drain terminals which is connected to the node Sa, and the other one of the source and drain terminals which is connected to the node N3.

The load circuit 203b includes a PMOS transistor 222 and a NMOS transistor 223. The PMOS transistor 222 has a gate provided with a read command signal (a signal provided from the control circuit 206), one of source and drain terminals which is connected to the power source voltage, and the other one of the source and drain terminals which is connected to a node Sb. The NMOS transistor 223 has a gate connected to a predetermined voltage source VCLMP, one of source and drain terminals which is connected to the node Sb, and the other one of the source and drain terminals which is connected to the node N4.

The voltage value that dropped by approximately the threshold voltage VT of the NMOS transistor 221 or the NMOS transistor 223 from the voltage value of the voltage source VCLMP, approximately corresponds to the maximum voltage value applied to the node N3 or the node N4, that is, the reference cell 201a or the reference cell 201b. The voltage value of the voltage source VCLMP is set such that the voltage value does not disturb the read operations of the reference cell 201a or the reference cell 201b. In Embodiment 1, the VCLMP is set to 0.9 V and a voltage of 0.5 V or higher is not applied to the reference cell 201a and the reference cell 201b.

In order that the reference cell 201a and the reference cell 201b perform read operations under the same conditions, the design is such that the PMOS transistor 220 and the PMOS transistor 222 have the same transistor size and are symmetrically laid out, and that the NMOS transistor 221 and the NMOS transistor 223 have the same transistor size and are symmetrically laid out.

Figure 9:
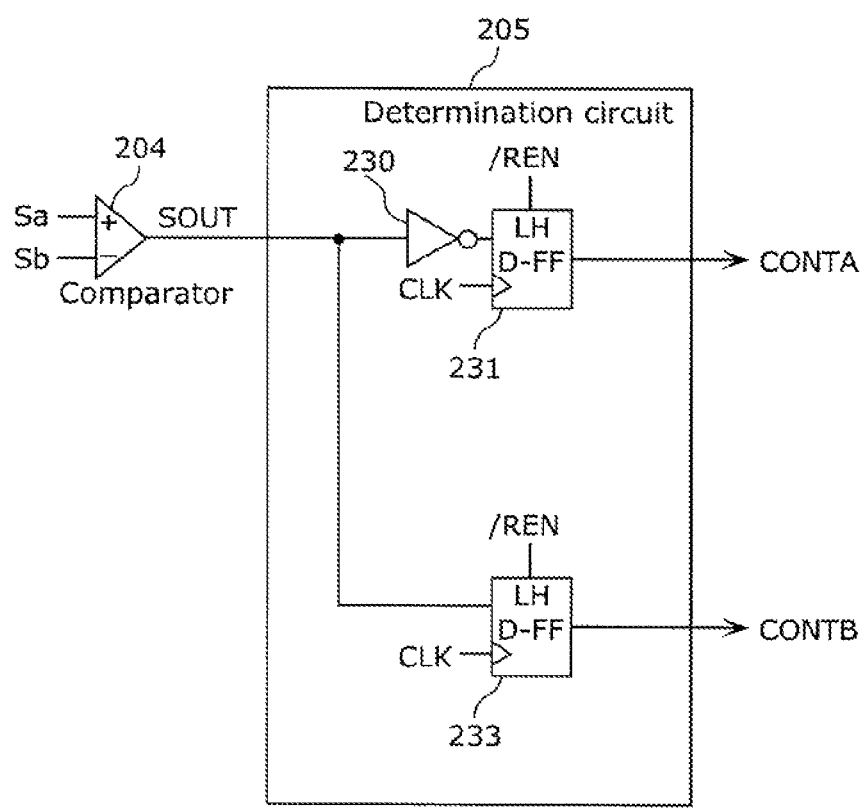
FIG. 9 is a configuration diagram of a determination circuit in the reference cell circuit according to Embodiments of the present invention.

FIG. 9 is a circuit diagram illustrating a specific example of the determination circuit 205.

The determination circuit 205 receives an output SOUT of the comparator 204, as an input. The inverter 230 receives the SOUT as an input. A D flip-flop (D-FF) with load hold 231 has a data input terminal provided with the output of the inverter 230, a clock input terminal provided with a reference clock CLK, and a load hold terminal provided with a reverse polarity signal of a read enable signal /REN (the "/" represents reverse polarity). The determination circuit 205 outputs, using the inverter 230 and the D-FF with load hold 231, an output of the D-FF with load hold 231 as a result determination signal CONTA.

Furthermore, a D-FF with load hold 233 has a data input terminal provided with the SOUT, a clock input terminal provided with a reference clock CLK, and a load hold terminal provided with a reverse polarity signal of a read enable signal /REN. The determination circuit 205 outputs, using the D-FF with load hold 233, an output of the D-FF with load hold 233, as a result determination signal CONTB.

The D-FF with load hold latches data of the data input terminal in synchronization with the rising edge of the reference clock CLK, when the level "L" is input to the load hold terminal. When the level "H" is input to the load hold terminal, the D-FF circuit keeps latching the data in the previous state regardless of the input of the reference clock.

Figure 10:
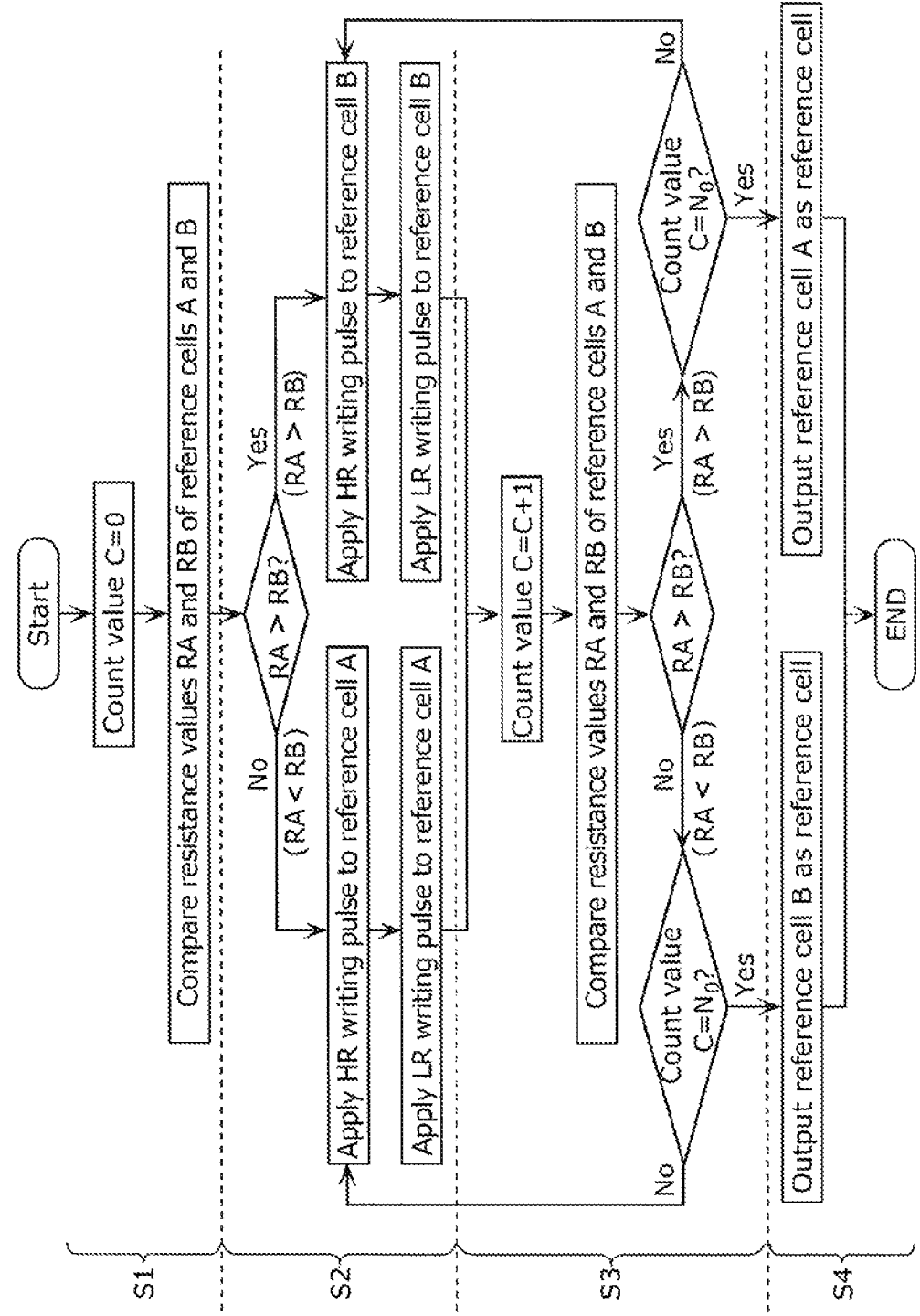
FIG. 10 is a flowchart of operations of the reference cell circuit according to Embodiments of the present invention.

Hereinafter, referring to the flowchart shown in FIG. 10, a description is given of a specific method for setting the reference cell circuit 200 where the upper limit value LRmax of the resistance of the LR state is set to the reference cell 201a or the reference cell 201b. In the flowchart of FIG. 10, the reference cells 201a and 201b are simply referred to as the reference cell A and the reference cell B, respectively.

FIG. 10 is a flowchart of an example of a method for setting the reference cell A or the reference cell B to the upper limit value LRmax of the resistance of the LR state.

(Step S1)

The count value C of the counter circuit 207 is reset to "0". The resistance values RA and RB of the reference cells A and B are read to be compared.

More specifically, the switches SWa2, SWb2, SWa3 and SWb3 are turned on and the switches SWa0, SWb0, SWa1, SWb1, SWa4, and SWb4 are turned off. The reference cells 201a and 201b are respectively connected to the load circuits 203a and 203b.

Here, a current flows to ground from the PMOS transistor 220 and the NMOS transistor 221 through the reference cell 201a. The voltage, which is determined by the ratio of the total of the resistance value of the reference cell 201a and the on resistance value of the NMOS transistor 221 to the on resistance value of the PMOS transistor 220, is output to the node Sa.

In the similar manner, a current flows to ground from the PMOS transistor 222 and the NMOS transistor 223 through the reference cell 201b. The voltage, which is determined by the ratio of the total of the resistance value of the reference cell 201b and the on resistance value of the NMOS transistor 223 to the on resistance value of the PMOS transistor 222, is output to the node Sa.

The comparator 204 compares the output voltages of the node Sa and the node Sb.

(Step S2)

When it is determined that RA<RB, a write operation is performed on the reference cell A. More specifically, only the switches SWa0 and SWa1 are turned on, and the HR writing pulse generation circuit 202H applies, to the node N1, a pulse voltage of a positive voltage VHR with reference to the node N2 for a predetermined period (50 ns in Embodiment 1). Since a positive voltage pulse is applied to the TE terminal with reference to the BE terminal, the reference cell A is changed to a high resistance state.

Next, the LR writing pulse generation circuit 202L applies, to the node N2, a pulse voltage of the positive voltage VLR with reference to the node N1 for a predetermined period (50 ns in Embodiment 1). Since the positive voltage pulse is applied to the BE terminal with reference to the TE terminal, the reference cell A is changed to a low resistance state.

On the other hand, when it is determined that RA>RB, a write operation is performed on the reference cell B. The operations in this case are the same as the operations described above except that only the switches SWb0 and SWb1 are turned on.

(Step S3)

The set value C of the counter circuit 207 is incremented by 1. By the method same as in Step S1, the resistance values RA and RB of the reference cells A and B are read to be compared. When the count value C of the counter circuit 207 is smaller than a predetermined count $N_o$, the processing returns to Step S2 and the write operation is performed again on the reference cell determined to have a lower resistance value.

(Step S4)

At step S3, when the count value C of the counter circuit 207 equals the predetermined count $N_o$, the reference cell determined to have a higher resistance value at this point is connected to the output terminal 208. More specifically, when it is determined that RA>RB, the switches SWa3 and SWa4 are turned on, and all of the other switches are turned off. When it is determined that RA<RB, the switches SWb3 and SWb4 are turned on, and all of the other switches are turned off.

Then, the setting operations end.

Figure 11:
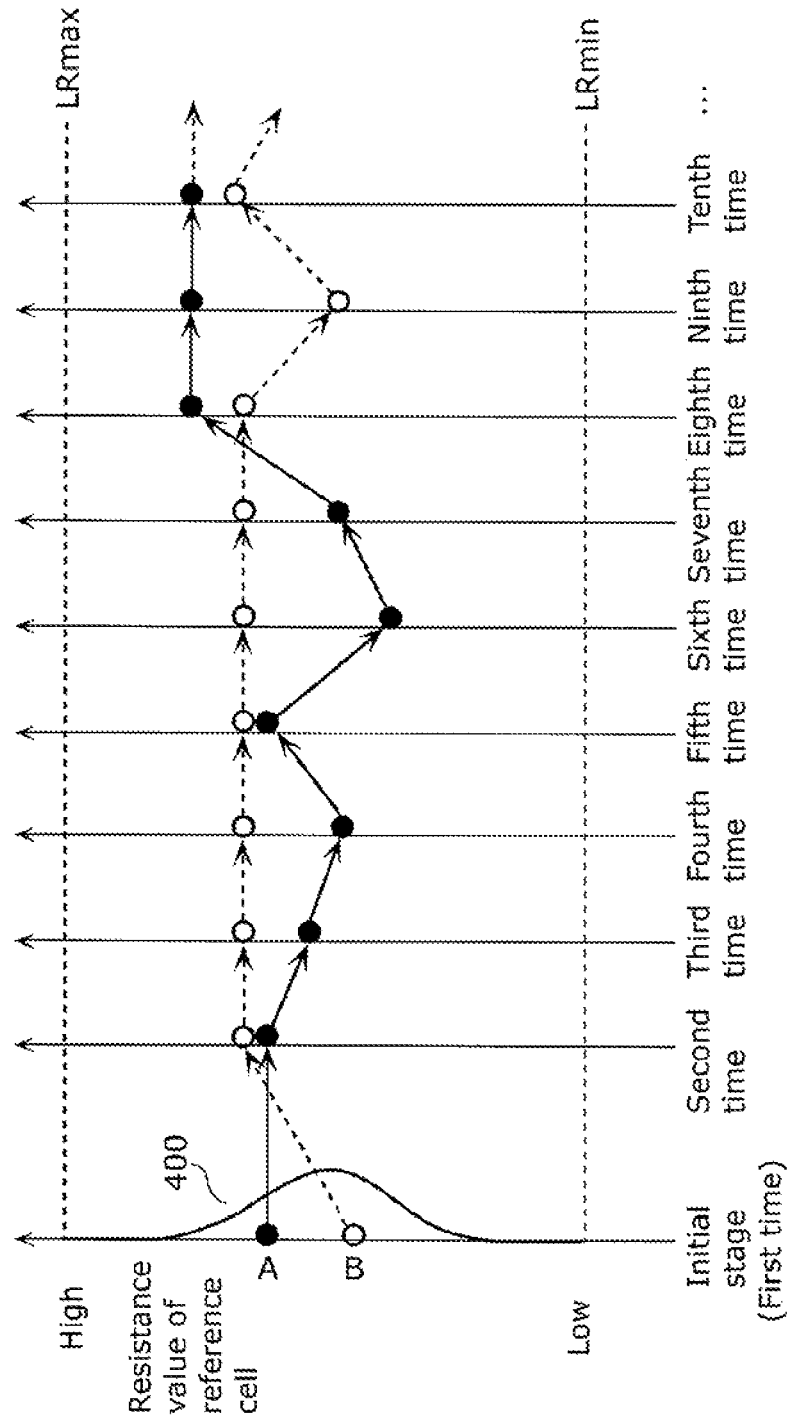
FIG. 11 is a conceptual diagram of operations of the reference cell circuit according to Embodiments of the present invention.

FIG. 11 is a graph explaining the idea of the shift in the resistance values of the reference cells A and B when the setting method is executed in the described order. A distribution 400 shows the LR bit variations of one memory cell which was described in the section of the basic data of the present invention. The black dots indicate the resistance values of the reference cell A, while the white dots indicate the resistance values of the reference cell B. These resistance values are hypothetical values for the purposes of this explanation.

It is assumed that the resistance value RA of the reference cell A is higher than the resistance value RB of the reference cell B (RA>RB) at the initial stage (at the first comparison) of the setting method. In this case, the first write operation is performed on the reference cell B.

As a result, at the second comparison, the reference cell B has a resistance value newly set with a probability according to the distribution 400. Here, it is assumed that the resistance value RB of the reference cell B is set to a value higher than the resistance value at the first comparison, and higher than the resistance value RA of the reference cell A. In this case, the second write operation is performed on the reference cell A having a lower resistance value.

The third and subsequent comparisons and write operations are repeated in the same manner. Here, it is assumed that the resistance value of the reference cell A is set to be higher than the resistance value of the reference cell B at the eighth comparison.

As a result, the eighth and subsequent write operations are performed on the reference cell B. At the tenth comparison, the resistance value of the reference cell A is set to be higher than the resistance value of the reference cell B and close to the upper limit value of the distribution 400.

The resistance value thus set is basically set with a probability according to the distribution 400. The write operation causes the resistance value to be set higher than the previous state in some cases, and to be set lower than the previous state in other cases. The repeated write operations stochastically cause the resistance value of one of the reference cells to be higher than the resistance value of the other reference cell.

By repeating the write operations a predetermined number of times or more, it is possible to make one of the reference cells to the state that is as close to the upper limit value of the distribution 400 (higher resistance value of the reference cells) as possible. For example, supposed that the distribution 400 is a normal distribution, repeating the operation 1000 times can expect a resistance value higher than 3σ, approximately three times. It may be that the set count $N_o$ of the count values described with reference to the flowchart of FIG. 10 is set to the stochastically expected number of times.

Alternatively, as in the states from second time to the seventh time indicated by the graph FIG. 11, the number of times the write operation is successively performed on one of the reference cells till the resistance value of the reference cell becomes higher than the resistance value of the other reference cell increases as the set resistance value approaches the upper limit value.

Therefore, it may be that a counter is provided for measuring the number of times the write operation is successively performed on one reference cell. The operations may end if performing the write operations on one of the reference cells (the reference cell having a lower resistance value) a predetermined number of times or more does not cause the resistance value of the reference cell to be higher than the resistance value of the other reference cell (the reference cell having a higher resistance value).

Next, a general description of the functional operations of the reference cell circuit 200 is given with reference to functional operation tables. Referring to the functional operation tables, the following describes the functional operations of the reference cell circuit 200 in the cases where the reference cell is set to the upper limit value LRmax of the resistance distribution of the LR state, the lower limit value LRmin of the resistance distribution of the LR state, the upper limit value HRmax of the resistance distribution of the HR state, and the lower limit value HRmin of the resistance distribution of the HR state.

(1) Setting the Reference Cell to the Upper Limit Value LRmax of the Resistance Distribution of the LR State Table 1 shows the functional operations of the reference cell circuit in the case where the reference cell is set to the upper limit value LRmax of the resistance distribution of the LR state.

TABLE 1

Control for setting a state close to LRmax (highest resistance state of the low resistance state)

| | | | Write operation | | | Output |
|---|---|---|---|---|---|---|
| Resistance values of reference cells | Read circuit Comparator | Determination Circuit | SWa0-SWa3, SWb4 | SWb0-SWb3, SWa4 | Reference cell to which voltage pulse is applied | Voltage pulse applied | operation Reference cell connected to output terminal |
| RA > RB | V(Sa) > V(Sb) SOUT = "H" | CONTA = "L" CONTB = "H" | OFF | ON | Reference Cell B 201b | High resistance writing pulse ↓ | Reference cell A (SWa3, SWa4 ON) |
| RA < RB | V(Sa) < V(Sb) SOUT = "L" | CONTA = "H" CONTB = "L" | ON | OFF | Reference cell A 201a | Low resistance writing pulse | Reference cell B (SWb3, SWb4 ON) |

When RA represents the resistance value of the reference cell 201a, and RB represents the resistance value of the reference cell 201b, Table 1 shows two operations performed according to the relation between the resistance value RA and the resistance value PB.

When it is determined that RA>RB as a result of the read operation of the reference cell, the output SOUT of the comparator 204 is "H" level. In the process of the read operation, /REN is "L" level, the load hold terminal receives an input of "L" level, the determination circuit 205 outputs, as latch data, a CONTA of "L" level and a CONTB of "H" level. On the other hand, when it is determined that RA<RB, the output SOUT of the comparator 204 is "L" level, and the determination circuit 205 outputs, as latch data, a CONTA of "H" level, and a CONTB of "L" level.

According to the combination of the CONTA and CONTB, one of the switch group including SWa0, SWa1, SWa2 and SWa3, and the switch group including SWb0, SWb1, SWb2, and SWb3 is turned on. The switch group turned on here is related to one of the reference cell 201a and the reference cell 201b determined to have a lower resistance value.

The HR writing pulse generation circuit 202H and the LR writing pulse generation circuit 202L perform, on the reference cell related to the switch group that is turned on, a write operation where a high resistance writing pulse and a low resistance writing pulse are applied in this order.

When it is determined that RA>RB as a result of repeating read operations and write operations a predetermined number of times, it is determined that the resistance value of the reference cell 201a is close enough to the upper limit value LRmax. Then, the switch SWa4 is turned on, electrically connecting the output terminal 208 and the reference cell 201a.

When it is determined that RA<RB as a result of repeating read operations and write operations a predetermined number of times, the reference cell 201b is electrically connected to the output terminal 208.

In principle, the case where RA=RB also exists. However, in practice, the comparator 204 is slightly asymmetric; and thus, the comparator 204 determines that one of the reference cells has a resistance value higher than that of the other reference cell. In such a case, there is hardly any difference between the two; and thus, any one of the cells may be selected.

(2) Setting the Reference Cell to the Lower Limit Value LRmin of the Resistance Distribution of the LR State Table 2 shows the functional operations of the reference cell circuit in the case where the reference cell is set to the lower limit value LRmin of the resistance distribution of the LR state.

RA<RB, a write operation is performed on the reference cell 201b. The reference cell, finally determined to have a lower resistance value as a result of repeating read operations and write operations a predetermined number of times, is electrically connected to the output terminal 208. The other operations are the same as described in (1); and thus, their descriptions are omitted.

(3) Setting the Reference Cell to the Upper Limit Value HRmax of the Resistance of the HR State Table 3 shows the functional operations of the reference cell circuit in the case where the reference cell is set to the upper limit value HRmax of the resistance of the HR state.

TABLE 2

Control for setting a state close to LRmin (lowest resistance state of the low resistance state)

| | | | Write operation | | | | Output |
|---|---|---|---|---|---|---|---|
| Resistance values of reference cells | Read circuit Comparator | Determination circuit | SWa0- SWa3, SWb4 | SWb0- SWb3, SWa4 | Reference cell to which voltage pulse is applied | Voltage pulse applied | operation Reference cell connected to output terminal |
| RA > RB | V(Sa) > V(Sb) SOUT = "H" | CONTA = "L" CONTB = "H" | ON | OFF | Reference cell A 201a | High resistance writing pulse ↓ Low resistance writing pulse | Reference cell B (SWb3, SWb4 ON) |
| RA < RB | V(Sa) < V(Sb) SOUT = "L" | CONTA = "H" CONTB = "L" | OFF | ON | Reference cell B 201b | Low resistance writing pulse | Reference cell A (SWa3, SWa4 ON) |

When it is determined that RA>RB as a result of the read operation of the reference cell, a write operation is performed on the reference cell 201a. When it is determined that

TABLE 3

Control for setting a state close to HRmax (highest resistance state of the high resistance state)

| | | | Write operation | | | | Output |
|---|---|---|---|---|---|---|---|
| Resistance values of reference cells | Read circuit Comparator | Determination circuit | SWa0- SWa3, SWb4 | SWb0- SWb3, SWa4 | Reference cell to which voltage pulse is applied | Voltage pulse applied | operation Reference cell connected to output terminal |
| RA > RB | V(Sa) > V(Sb) SOUT = "H" | CONTA = "L" CONTB = "H" | OFF | ON | Reference Cell B 201b | Low resistance writing pulse ↓ High resistance writing pulse | Reference cell A (SWa3, SWa4 ON) |
| RA < RB | V(Sa) < V(Sb) SOUT = "L" | CONTA = "H" CONTB = "L" | ON | OFF | Reference cell A 201a | High resistance writing pulse | Reference cell B (SWb3, SWb4 ON) |

In this case, the order of applying the HR writing pulse and the LR writing pulse is reverse compared to that in (1).

When it is determined that RA>RB as a result of the read operation of the reference cell, a write operation is performed on the reference cell 201b. Here, after setting the reference cell 201b to the LR state by an application of the LR writing pulse generated by the LR writing pulse generation circuit 202L, the reference cell 201b is set to the HR state by an application of the HR writing pulse generated by the HR writing pulse generation circuit 202H.

When it is determined that RA<RB, a write operation is performed on the reference cell 201a in the similar manner where a LR writing pulse is applied and then a HR writing pulse is applied. The reference cell, finally determined to have a higher resistance value as a result of repeating read operations and write operations a predetermined number of times, is electrically connected to the output terminal 208.

The other operations are the same as described in (1); and thus, their descriptions are omitted.

(4) Setting the Reference Cell to the Lower Limit Value HRmin of the Resistance of the HR State Table 4 shows the functional operations of the reference cell circuit in the case where the reference cell is set to the lower limit value HRmin of the resistance in the HR state.

TABLE 4

Control for setting a state close to HRmin lowest resistance state of the high resistance state)

| | | | Write operation | | | | Output |
|---|---|---|---|---|---|---|---|
| Resistance values of reference cells | Read circuit Comparator | Determination circuit | SWa0-SWa3, SWb4 | SWb0-SWb3, SWa4 | Reference cell to which voltage pulse is applied | Voltage pulse applied | operation Reference cell connected to output terminal |
| RA > RB | V(Sa) > V(Sb) SOUT = "H" | CONTA = "L" CONTB = "H" | ON | OFF | Reference cell A 201a | Low resistance writing pulse ↓ | Reference cell B (SWb3, SWb4 ON) |
| RA < RB | V(Sa) < V(Sb) SOUT = "L" | CONTA = "H" CONTB = "L" | OFF | ON | Reference cell B 201b | High resistance writing pulse | Reference cell A (SWa3, SWa4 ON) |

When it is determined that RA>RB as a result of the read operation of the reference cell, a write operation is performed on the reference cell 201a. When it is determined that RA<RB, a write operation is performed on the reference cell 201b. In the write operation, a LR writing pulse is applied to the target reference cell, and then a HR writing pulse is applied to the target reference cell. The reference cell, finally determined to have a lower resistance value as a result of repeating the read operations and the write operations a predetermined number of times, is electrically connected to the output terminal 208. The other operations are the same as described in (1); and thus, their descriptions are omitted.

The reference cells having the resistance values of the LRmax, LRmin, HRmax, and HRmin described from (1) to (4) above may be used independently or the reference cells having the resistance values of the two or more resistance values may be used in combination, depending on the problems to be solved.

In the write operations described in (1) to (4) above, a first pulse is applied to the reference cell to be written for setting the reference cell to the resistance state opposite to the target resistance state, and then the second pulse is applied to the same reference cell for setting to the target resistance state; however, it may be that only the pulse for setting the reference cell to the target resistance state is applied without applying the first pulse.

The reference cell circuit has been described where the resistance value of one of the two reference cells is made close to the lower limit value or the upper limit value of the target resistance state; however, it may be that the reference cell circuit includes more than two reference cells.

For example, such a reference cell circuit may have the following configuration. For example, the reference cell circuit includes another set including the reference cells 201a and 201b, the read circuit 203, the comparator 204, the switches SWa0, SWb0, SWa1, SWb1, SWa2, SWb2, SWa3, SWb3, SWa4, and SWb4, which are surrounded by the dashed lines in FIG. 6. The reference cell circuit further includes a second comparator which compares the resistance values of the reference cells connected to the output terminals of the respective sets, and a second output circuit which connects the reference cell corresponding to the result of the comparison by the second comparator to the output terminal. The pulse generation circuit 202, the determination circuit 205, the control circuit 206, and the counter circuit 207 may be shared between the two sets, or may be included for each set.

In the reference cell circuit having such a configuration, under the control of the control circuit 206, the write operation and the output operation described above are performed one or more times for each set. Of the reference cells connected to the output terminals of the respective sets, the reference cell corresponding to the result of the comparison by the second comparator is connected to the output terminal by the second output circuit.

As a result, the reference cell connected to the output terminal of the second output circuit can have a resistance value closer to the upper limit value or the lower limit value of the target resistance state.

Embodiment 2

Next, a description is given of a variable resistance nonvolatile memory device according to Embodiment 2 of the present invention where the reference cell circuit 200 is used as a read circuit.

Figure 12:
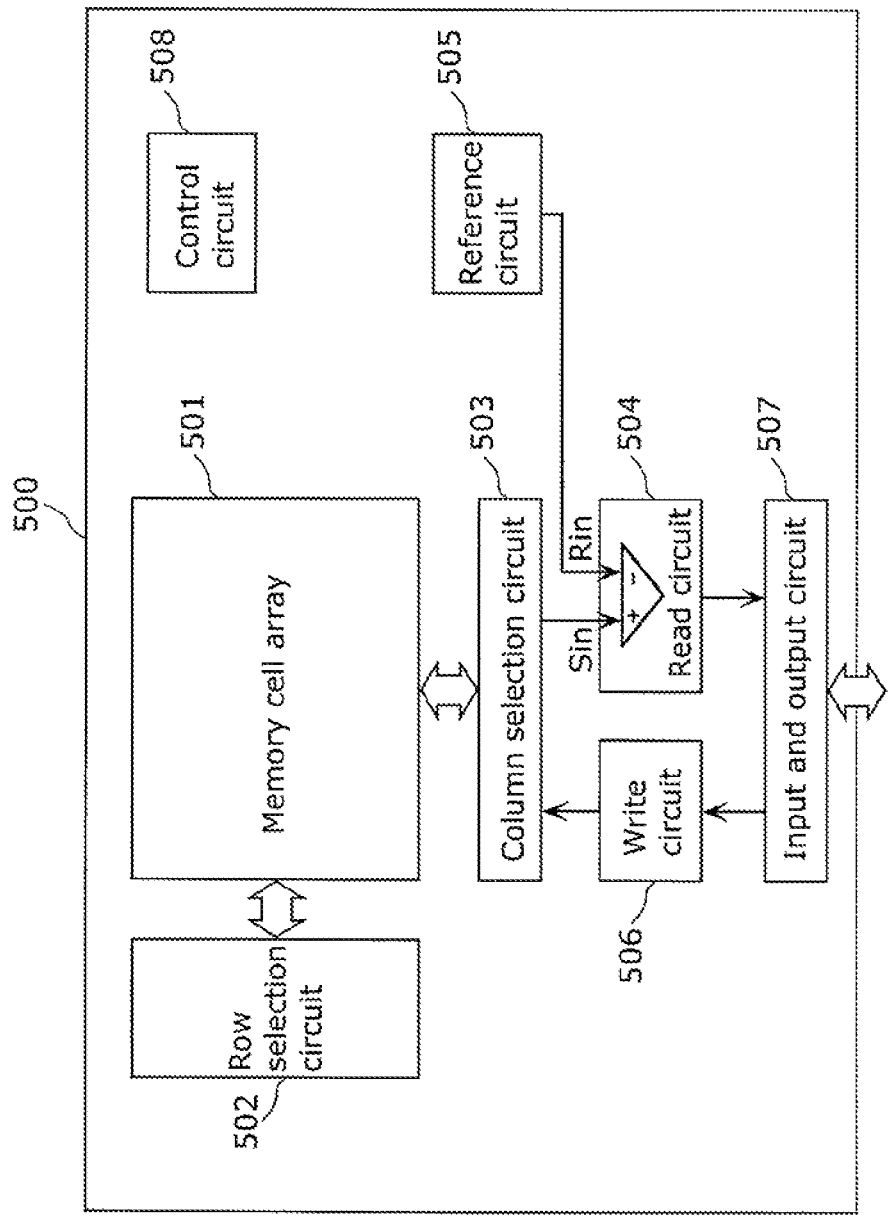
FIG. 12 is a configuration diagram of a first example of the variable resistance nonvolatile memory device which includes the reference cell circuit according to Embodiments of the present invention.

FIG. 12 is a functional block diagram illustrating an example of the variable resistance nonvolatile memory device where the reference cell circuit is used as a reference circuit which generates a reference level for reading. A variable resistance nonvolatile memory device 500 includes: a memory cell array 501 having variable resistance memory cells each of which has a variable resistance element and which are arranged in rows and columns; a row selection circuit 502 which selects a row direction; a column selection circuit 503 which selects a column direction; a read circuit 504 which converts the resistance value of the selected variable resistance memory cell to a logical value of "1" or "0"; a reference circuit 505; a write circuit 506 which applies a predetermined pulse width or a pulse voltage to write the logical value of "1" or "0" by setting the selected memory cell to a low resistance state or a high resistance state; an input and output circuit 507 which inputs and outputs data to and from outside the variable resistance nonvolatile memory device 500; and a control circuit 508 which controls the operations of the variable resistance nonvolatile memory device 500.

The reference circuit 505 includes the reference cell circuit 200 described with reference to FIG. 5A and FIG. 5B. In the reference circuit 505, a reference current flows which is intermediate between the memory cell current of the high resistance state and the memory cell current of the low resistance state.

The read circuit 504 includes a differential amplifier which compares a current flowing in the variable resistance memory cell selected in the memory cell array 501 via the column selecting circuit 503 with a reference current flowing in the reference circuit 505.

Figure 13:
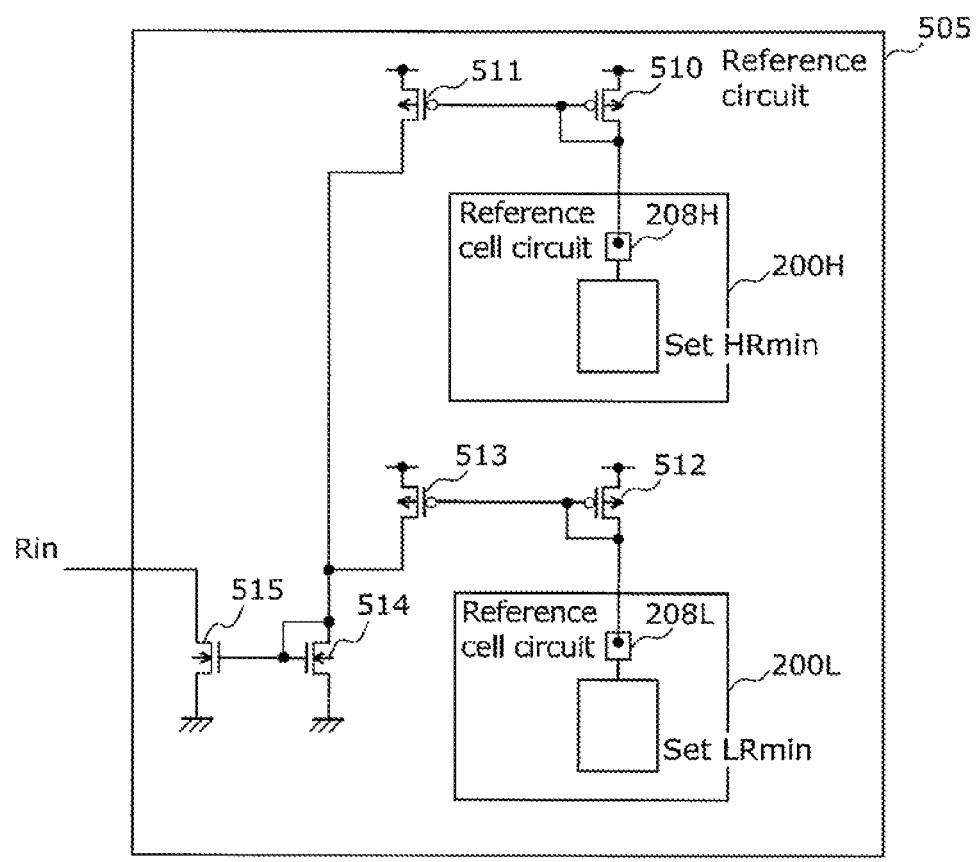
FIG. 13 is a configuration diagram of a reference circuit in the first example of the variable resistance nonvolatile memory device according to Embodiments of the present invention.

FIG. 13 is a circuit configuration of the reference circuit 505. A reference cell circuit 200H includes the reference cell circuit 200 in which a control is performed for setting a resistance value close to HRmin (the lower limit value of the resistance distribution of the high resistance state) described with reference to Table 4. A reference cell circuit 200L includes the reference cell circuit 200 in which a control is performed for setting a resistance value close to LRmax (the upper limit value of the resistance distribution of the low resistance state) described with reference to Table 1.

A PMOS transistor 510 has a gate connected to a drain, and a source connected to the power source. The drain of the PMOS transistor 510 is also connected to an output terminal 208H of the reference cell circuit 200H. The gate of the PMOS transistor 510 is commonly connected to the gate of the PMOS transistor 511 to form a first current mirror.

A PMOS transistor 512 has a gate connected to a drain, and a source connected to the power source. The drain of the PMOS transistor 512 is also connected to an output terminal 208L of the reference cell circuit 200L. The gate of the PMOS transistor 512 is commonly connected to the gate of the PMOS transistor 513 to form a second current mirror.

The drain of the PMOS transistor 511 and the drain of the PMOS transistor 513 are commonly connected, and are further connected to the drain of the NMOS transistor 514. An NMOS transistor 514 has a source connected to the ground, and a gate commonly connected to a drain. The gate of the NMOS transistor is also connected to the gate of the NMOS transistor 515 to form a third current mirror. The drain of the NMOS transistor 515 is connected to a reference terminal of the read circuit 504 as a terminal Rin.

Here, as an example, the PMOS transistor 510 is designed to have the same transistor size (channel width W and the channel length L) as that of the PMOS transistor 512. In order that each of the first current mirror and the second current mirror each has a current mirror ratio of ½, the channel width W of the PMOS transistor 511 and the PMOS transistor 513 are designed to be ½ of the channel width W of the PMOS transistor 510 and the PMOS transistor 512.

In the reference circuit 505 having such a configuration, the PMOS transistor 510 generates, in the reference cell circuit 200H, the current IHRmax corresponding to the lower limit value of the resistance value of the high resistance state, and its ½ current (IHRmax/2) is mirrored to the PMOS transistor 511. The PMOS transistor 512 generates, in the reference cell circuit 200L, the current ILRmin corresponding to the upper limit value of the resistance value of the low resistance state, and its ½ current (ILRmin/2) is mirrored to the PMOS transistor 513.

Since a wired connection is being made between the PMOS transistors 511 and 513, the NMOS transistor 515 generates a current of (IHRmax/2)+(ILRmin/2), that is, a current corresponding to an intermediate current between IHRmax and ILRmin by the third current mirror.

The reference levels of the reference cell circuit 200H and the reference cell circuit 200L are set according to the flowchart shown in FIG. 10 at the manufacturing stage (manufacturing process) of the variable resistance nonvolatile memory device 500 before shipment, or while the variable resistance nonvolatile memory device 500 is not being used (in a standby or an idle state); and thus, there is no influence on the write operations or read operations as a memory device.

The reference circuit 505 according to Embodiment 2 uses both the reference cell circuits 200H and 200L; however, the reference circuit 505 may use only one reference cell circuit. For example, only the reference cell circuit 200L is used and the mirror ratio of the PMOS transistor 512 and the PMOS transistor 513 is adjusted for determining a reference current with respect to the upper limit value (LRmax) of the resistance distribution of the low resistance state.

Embodiment 3

Next, a description is given of a variable resistance nonvolatile memory device according to Embodiment 3 of the present invention where the reference cell circuit 200 is used as a refresh command circuit.

Figure 14:
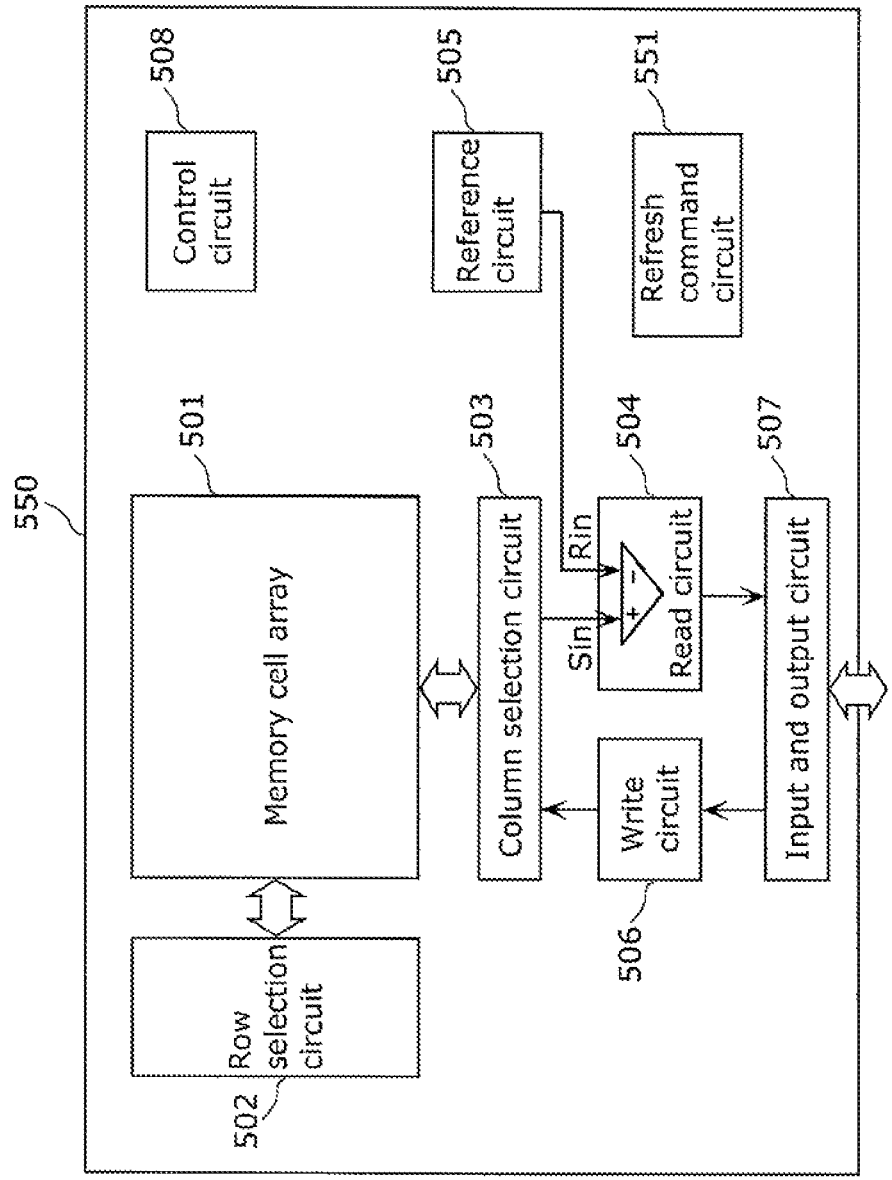
FIG. 14 is a configuration diagram of a second example of the variable resistance nonvolatile memory device which includes the reference cell circuit according to Embodiments of the present invention.

FIG. 14 is a functional block diagram illustrating an example of a variable resistance nonvolatile memory device in which a reference cell circuit is used for a refresh command circuit which commands the time for refreshing the stored content. A variable resistance nonvolatile memory device 505 in FIG. 14 is different from the variable resistance nonvolatile memory device 500 in FIG. 12 in that a refresh command circuit 551 is added.

The memory cell array 501 includes variable resistance memory cells having non-volatility. It is considered that the resistance values set to the memory cells change over long periods of time. In such a case, a refresh operation is effective in which data written in the memory cell is read and the read data is rewritten into the memory cell before the resistance value becomes the threshold level of the read circuit for reading. The refresh command circuit 551 is a circuit which detects the time when the refresh is necessary and outputs a refresh command signal.

Figure 15:
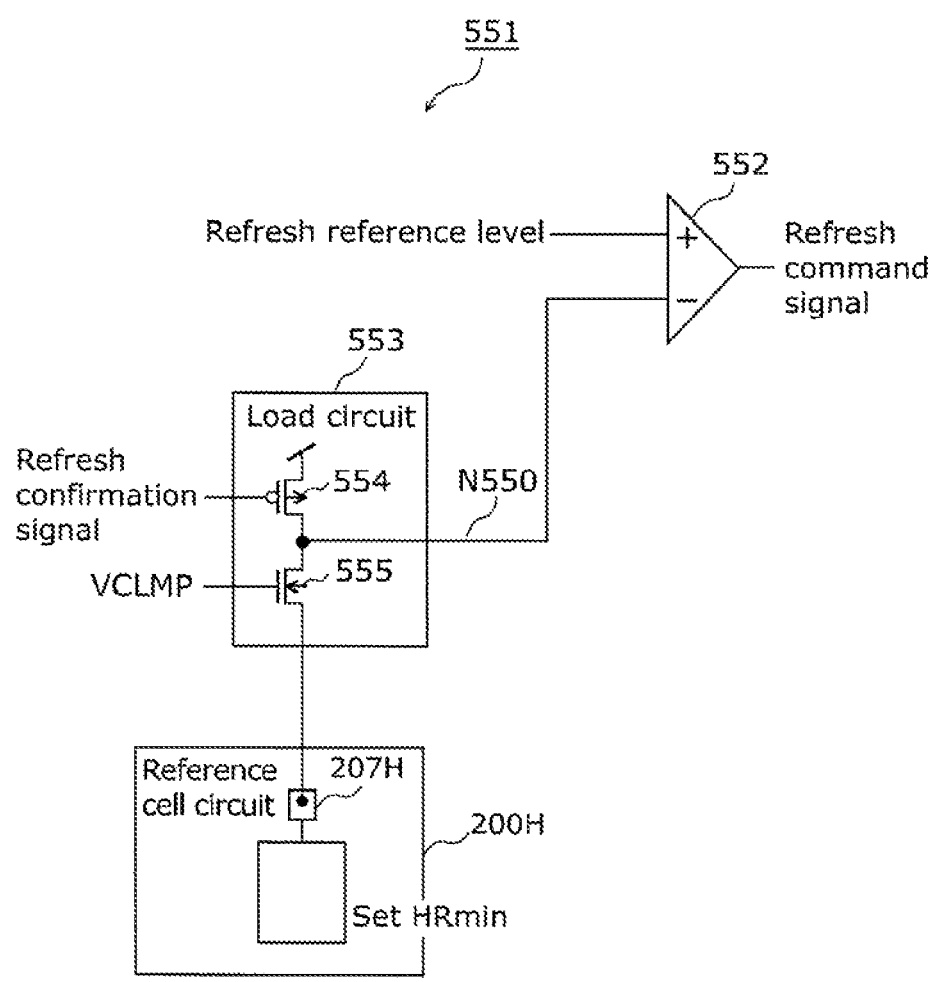
FIG. 15 is a configuration diagram of a refresh command circuit in the second example of the variable resistance nonvolatile memory device according to Embodiments of the present invention.

FIG. 15 is a circuit diagram of the refresh command circuit 551. A reference cell circuit 200H includes the reference cell circuit 200 in which a control is performed for setting a resistance value close to HRmin (the lower limit value of the resistance distribution of the high resistance state) described with reference to Table 4.

A load circuit 553 includes a PMOS transistor 554 and an NMOS transistor 555. The PMOS transistor 554 has a gate provided with a refresh confirmation signal, one of a source and a drain terminal connected to the power source voltage, and the other one of the source and the drain terminal connected to a node N556. The NMOS transistor 555 has a gate connected to a predetermined voltage source VCLMP, one of a source and a drain terminal connected to the node N556, and the other one of the source and the drain terminal connected to an output terminal 208H of the reference cell circuit 200H. A comparator 552 compares the voltage of the node N556 with the voltage of the refresh reference level that is a reference voltage, and outputs a refresh command signal.

Figure 16:
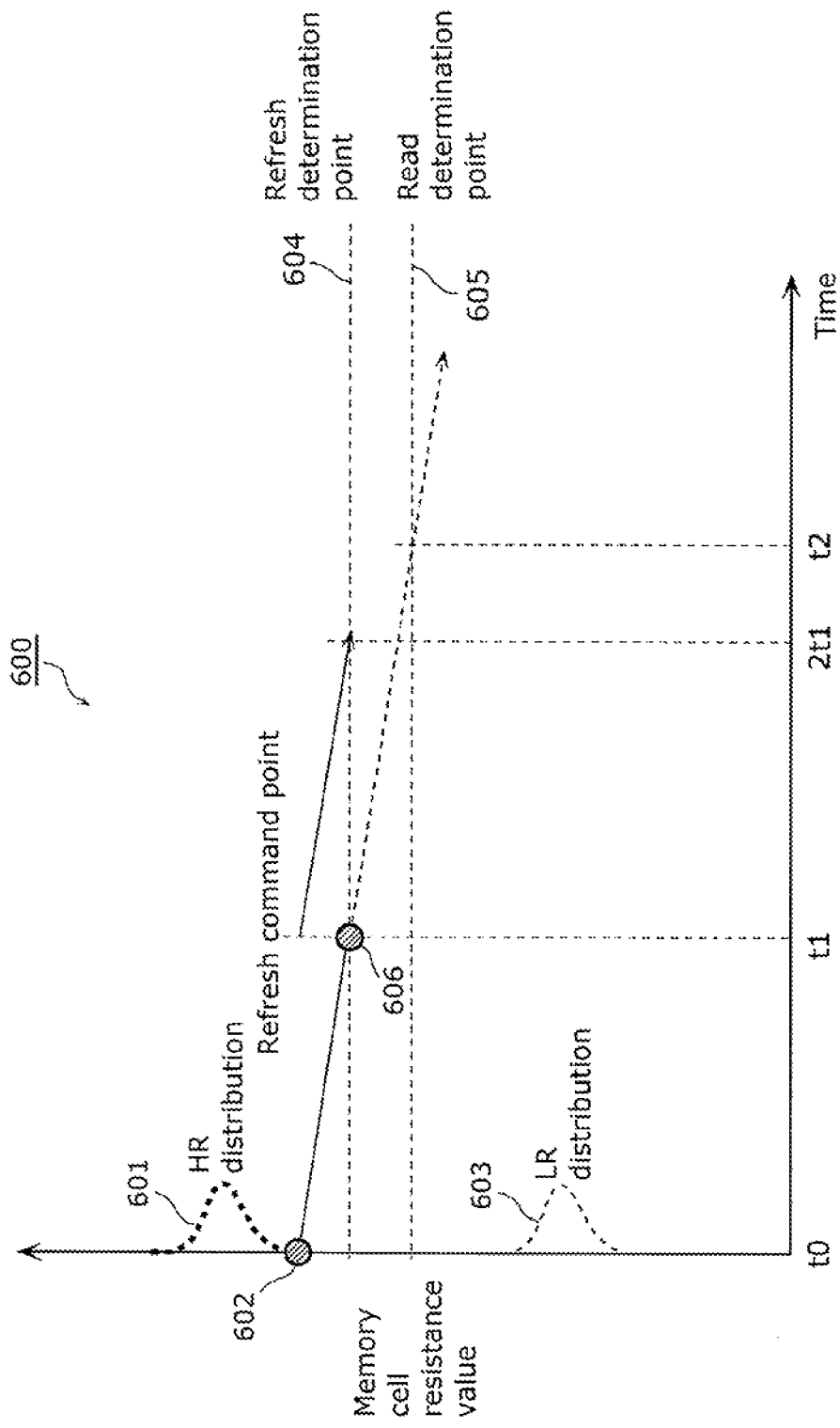
FIG. 16 is a conceptual diagram of operations of the second example of the variable resistance nonvolatile memory device according to Embodiments of the present invention.

A description is given of the operations of the refresh command circuit 551 having such a configuration, referring to the timing diagram in FIG. 16.

In the timing diagram in FIG. 16, the horizontal axis indicates time elapsed from time t0 at which the last setting operation of the reference cell circuit is performed, and the vertical axis indicates the resistance value of the reference cell. At time t0, the resistance value of the reference cell is set to the lower limit value 602 of the resistance distribution of the high resistance state.

A HR distribution 601 indicates the distribution of array variations of the memory cells into which the high resistance state is written. A LR distribution 603 indicates the distribution of array variations of the memory cells into which the low resistance state is written.

As time advances, the resistance value of the reference cell decreases from the lower limit value 602 of the resistance distribution of the high resistance state, and reaches the resistance value of a refresh determination point 604 at time t1. If remain untouched, the resistance value reaches a read determination point 605 at time t2. Here, the time t1 at which the resistance value reaches the refresh determination point 604 is determined as a refresh command point 606. At this point, a refresh command signal for commanding a refresh is output, a refresh operation of data of the memory cell is performed, and the reference cell is reset.

Embodiment 3 shows an example where the resistance value of the high resistance state changes over time. In the case where the resistance value of the low resistance state changes, it is apparent that the time for refresh can be commanded in the similar manner by setting the resistance value close to LRmax (the upper limit value of the resistance distribution of the low resistance state) described with reference to Table 1.

It is desirable that the reference cell 201a and the reference cell 201b include the memory cells having the same configuration as the memory cells included in the nonvolatile memory device body.

For example, in the case of the 1T1R type nonvolatile memory device, a reference cell may include a 1T1R type memory cell 100 which has the variable resistance memory element 101 and the NMOS transistor 102 (described with reference to FIG. 2) connected in series.

Figure 17:
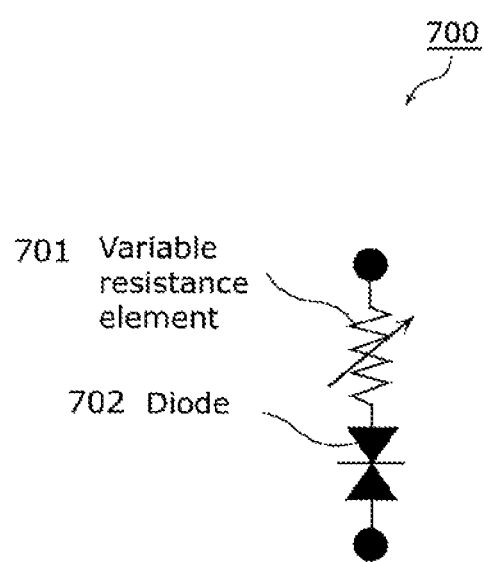
FIG. 17 is a circuit diagram of a crosspoint type memory cell according to Embodiments of the present invention.
Figure 18:
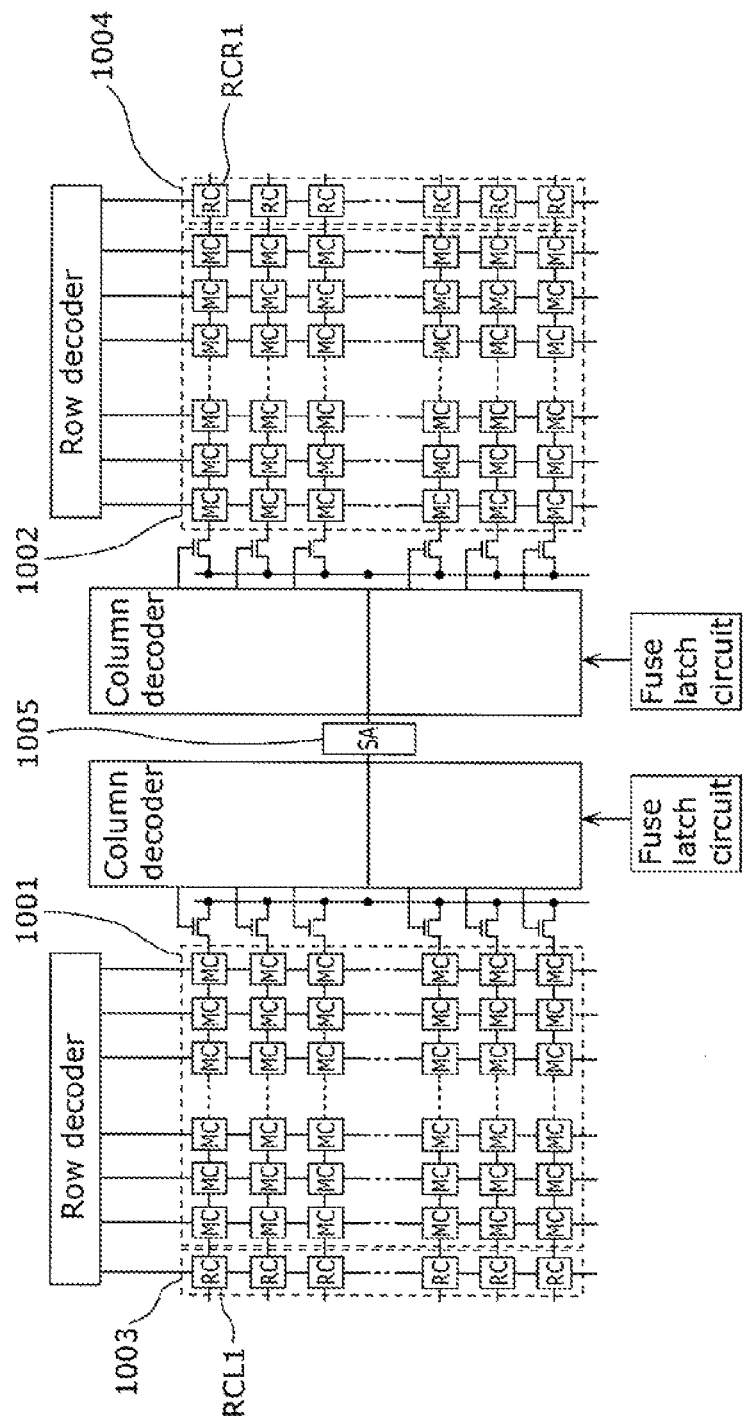
FIG. 18 is a configuration diagram of a conventional nonvolatile memory device.
Figure 19:
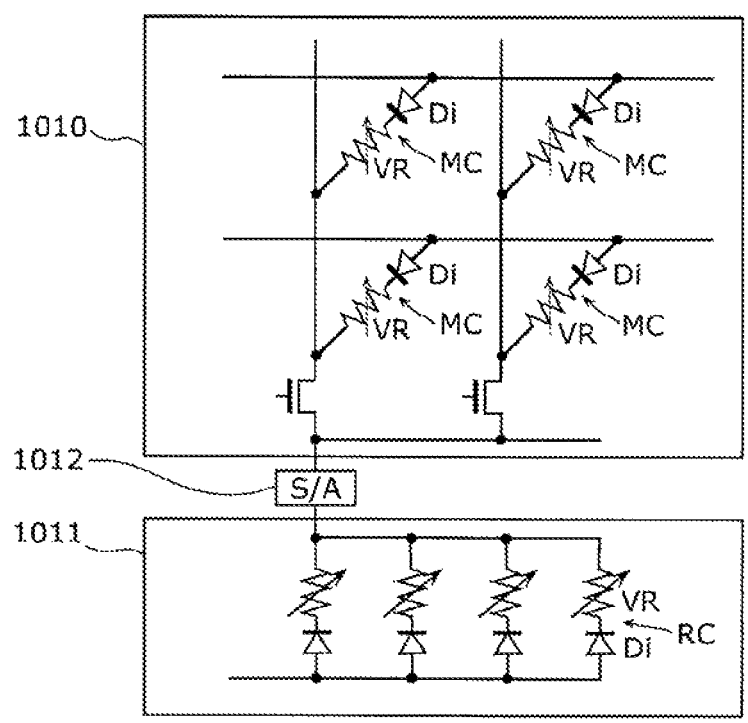
FIG. 19 is a configuration diagram of another conventional nonvolatile memory device.

Furthermore, for example, in the case of a crosspoint type nonvolatile memory device, a reference cell may include a crosspoint type memory cell 700 which has the variable resistance element 701 and the diode 702 (shown in FIG. 17) connected in series.

INDUSTRIAL APPLICABILITY

As described above, according to the present invention, a reference cell having a variable resistance element can achieve a reference level which reflects the distribution of the resistance values of a memory cell array. For example, in the case where the present invention is applied to a variable resistance nonvolatile memory, it is useful for achieving a reliable memory with stable read operations and excellent data retention characteristics.

The invention claimed is:

1. A reference cell circuit comprising:
a first reference cell and a second reference cell each of which includes a variable resistance element which reversibly changes between a low resistance state and a high resistance state according to an application of an electric signal, the low resistance state having a resistance value within a first range, and the high resistance state having a resistance value within a second range which has a lower limit value higher than an upper limit value of the first range;
a comparator which compares a resistance value of the first reference cell with a resistance value of the second reference cell;
a control circuit;
an application circuit which applies an electric signal to a reference cell that is one of the first reference cell and the second reference cell and that is selected by the control circuit, the electric signal being for setting the selected reference cell to a target state which is one of the low resistance state and the high resistance state; and
an output circuit which electrically connects, to an output terminal, a reference cell that is one of the first reference cell and the second reference cell and that is selected by the control circuit,
wherein the control circuit executes a comparison operation and a write operation one or more times, to make the resistance value of the first reference cell or the resistance value of the second reference cell close to a target resistance value that is a lower limit value or an upper limit value of the target state, the comparison operation causing the comparator to perform the comparison, and the write operation causing the application circuit to apply the electric signal to a reference cell that is one of the first reference cell and the second reference cell and that has a resistance value further from the target resistance value according to each result of the comparison by the comparator, and
after the write operation, the control circuit executes an output operation which causes the output circuit to electrically connect, to the output terminal, a reference cell that is one of the first reference cell and the second reference cell and that has a resistance value closer to the target resistance value according to a result of the comparison by the comparator.

2. The reference cell circuit according to claim 1, further comprising
a pulse generation circuit which generates the electric signal.

3. The reference cell circuit according to claim 1,
wherein the application circuit applies, as the electric signal, a first pulse signal and a second pulse signal to the reference cell selected by the control circuit, the first pulse signal being for setting the first reference cell and the second reference cell to one of the low resistance state and the high resistance state which is different from the target state, and the second pulse signal being applied after the first pulse signal for setting the first reference cell and the second reference cell to the target state.

4. The reference cell circuit according to claim 1,
wherein each of the first reference cell and the second reference cell includes the variable resistance element and a transistor connected in series.

5. The reference cell circuit according to claim 1,
wherein each of the first reference cell and the second reference cell includes the variable resistance element and a diode connected in series.

6. The reference cell circuit according to claim 1,
wherein the variable resistance element comprises tantalum oxide.

7. The reference cell circuit according to claim 1,
wherein, to make the resistance value of the first reference cell or the resistance value of the second reference cell close to an upper limit value of the low resistance state, the control circuit causes, for each write operation, the application circuit to apply, to one of the first reference cell and the second reference cell determined by the comparator to have a lower resistance value, an electric signal for setting the determined one of the first reference cell and the second reference cell to the low resistance state, and in the output operation, the control circuit causes the output circuit to electrically connect, to the output terminal, one of the first reference cell and the second reference cell determined by the comparator to have a higher resistance value.

8. The reference cell circuit according to claim 1,
wherein, to make the resistance value of the first reference cell or the resistance value of the second reference cell close to a lower limit value of the low resistance state, the control circuit causes, for each write operation, the application circuit to apply, to one of the first reference cell and the second reference cell determined by the comparator to have a higher resistance value, an electric signal for setting the determined one of the first reference cell and the second reference cell to the low resistance state, and in the output operation, the control circuit causes the output circuit to electrically connect, to the output terminal, one of the first reference cell and the second reference cell determined by the comparator to have a lower resistance value.

9. The reference cell circuit according to claim 1,
wherein, to make the resistance value of the first reference cell or the resistance value of the second reference cell close to an upper limit value of the high resistance state, the control circuit causes, for each write operation, the application circuit to apply, to one of the first reference cell and the second reference cell determined by the comparator to have a lower resistance value, an electric signal for setting the determined one of the first reference cell and the second reference cell to the high resistance state, and in the output operation, the control circuit causes the output circuit to electrically connect, to the output terminal, one of the first reference cell and the second reference cell determined by the comparator to have a higher resistance value.

10. The reference cell circuit according to claim 1,
wherein, to make the resistance value of the first reference cell or the resistance value of the second reference cell close to a lower limit value of the high resistance state, the control circuit causes, for each write operation, the application circuit to apply, to one of the first reference cell and the second reference cell determined by the comparator to have a higher resistance value, an electric signal for setting the determined one of the first reference cell and the second reference cell to the high resistance state, and in the output operation, the control circuit causes the output circuit to electrically connect, to the output terminal, one of the first reference cell and the second reference cell determined by the comparator to have a lower resistance value.

11. The reference cell circuit according to claim 1, further comprising
an other set of the first reference cell, the second reference cell, the comparator, the application circuit, and the output circuit,
wherein the control circuit executes the write operation and the output operation one or more times for each set, and
the reference cell circuit further comprises:
a second comparator which compares the resistance values of the reference cells connected to the output terminals of the respective sets; and
a second output circuit which connects, to an output terminal, one of the reference cells connected to the output terminals of the respective sets according to a result of the comparison by the second comparator.

12. A variable resistance nonvolatile memory device comprising:
a memory cell array which includes a plurality of memory cells arranged in rows and columns, each of the memory cells including a variable resistance element which reversibly changes between a low resistance state and a high resistance state according to an application of an electric signal, the low resistance state having a resistance value within a first range, the high resistance state having a resistance value within a second range which has a lower limit value higher than an upper limit value of the first range;
a reference circuit which includes at least one reference cell circuit, and generates a reference level for determining a resistance state of each of the memory cells with reference to a resistance value of a reference cell connected to an output terminal of the at least one reference cell circuit; and
a read circuit which determines whether each memory cell is in the low resistance state or in the high resistance state by comparing a signal level obtained from the memory cell with the reference level generated by the reference circuit,
wherein each of the at least one reference cell circuit includes:
a first reference cell and a second reference cell each of which includes a variable resistance element which reversibly changes between the low resistance state and the high resistance state according to an application of an electric signal;
a comparator which compares a resistance value of the first reference cell with a resistance value of the second reference cell;
a control circuit;
an application circuit which applies an electric signal to a reference cell that is one of the first reference cell and the second reference cell and that is selected by the control circuit, the electric signal being for setting the selected reference cell to a target state which is one of the low resistance state and the high resistance state; and
an output circuit which electrically connects, to an output terminal, a reference cell that is one of the first reference cell and the second reference cell and that is selected by the control circuit,
wherein the control circuit executes a comparison operation and a write operation one or more times, to make the resistance value of the first reference cell or the resistance value of the second reference cell close to a target resistance value that is a lower limit value or an upper limit value of the target state, the comparison operation causing the comparator to perform the comparison, and the write operation causing the application circuit to apply the electric signal to a reference cell that is one of the first reference cell and the second reference cell and that has a resistance value further from the target resistance value according to each result of the comparison by the comparator, and after the write operation, the control circuit executes an output operation which causes the output circuit to electrically connect, to the output terminal, a reference cell that is one of the first reference cell and the second reference cell and that has a resistance value closer to the target resistance value according to a result of the comparison by the comparator.

13. The variable resistance nonvolatile memory device according to claim 12, wherein the reference circuit includes, as the at least one reference cell circuit, a first reference cell circuit and a second reference cell circuit, wherein, (i) to make the resistance value of the first reference cell or the resistance value of the second reference cell included in the first reference cell circuit close to an upper limit value of the low resistance state, a control circuit included in the first reference cell circuit causes, for each write operation, the application circuit to apply, to one of the first reference cell and the second reference cell included in the first reference cell circuit and determined by the comparator to have a lower resistance value, an electric signal for setting the determined one of the first reference cell and the second reference cell to the low resistance state, and in the output operation, causes the output circuit to electrically connect, to the output terminal, one of the first reference cell and the second reference cell included in the first reference cell circuit and determined by the comparator to have a higher resistance value, or (ii) to make the resistance value of the first reference cell or the resistance value of the second reference cell included in the first reference cell circuit close to a lower limit value of the low resistance state, the control circuit included in the first reference cell circuit causes, for each write operation, the application circuit to apply, to one of the first reference cell and the second reference cell included in the first reference cell circuit and determined by the comparator to have a higher resistance value, an electric signal for setting the determined one of the first reference cell and the second reference cell to the low resistance state, and in the output operation, causes the output circuit to electrically connect, to the output terminal, one of the first reference cell and the second reference cell included in the first reference cell circuit and determined by the comparator to have a lower resistance value, and wherein, (i) to make the resistance value of the first reference cell or the resistance value of the second reference cell included in the second reference cell circuit close to an upper limit value of the high resistance state, a control circuit included in the second reference cell circuit causes, for each write operation, the application circuit to apply, to one of the first reference cell and the second reference cell included in the second reference cell circuit and determined by the comparator to have a lower resistance value, an electric signal for setting the determined one of the first reference cell and the second reference cell to the high resistance state, and in the output operation, causes the output circuit to electrically connect, to the output terminal, one of the first reference cell and the second reference cell included in the second reference cell circuit and determined by the comparator to have a higher resistance value, or (ii) to make the resistance value of the first reference cell or the resistance value of the second reference cell included in the second reference cell circuit close to a lower limit value of the high resistance state, the control circuit included in the second reference cell circuit causes, for each write operation, the application circuit to apply, to one of the first reference cell and the second reference cell included in the second reference cell circuit and determined by the comparator to have a higher resistance value, an electric signal for setting the determined one of the first reference cell and the second reference cell to the high resistance state, and in the output operation, causes the output circuit to electrically connect, to the output terminal, one of the first reference cell and the second reference cell included in the second reference cell circuit and determined by the comparator to have a lower resistance value.

14. The variable resistance nonvolatile memory device according to claim 13, wherein, to make the resistance value of the first reference cell or the resistance value of the second reference cell included in the first reference cell circuit close to an upper limit value of the low resistance state, the control circuit included in the first reference cell circuit causes, for each write operation, the application circuit to apply, to one of the first reference cell and the second reference cell included in the first reference cell circuit and determined by the comparator to have a lower resistance value, an electric signal for setting the determined one of the first reference cell and the second reference cell to the low resistance state, and in the output operation, causes the output circuit to electrically connect, to the output terminal, one of the first reference cell and the second reference cell included in the first reference cell circuit and determined by the comparator to have a higher resistance value, wherein, to make the resistance value of the first reference cell or the resistance value of the second reference cell included in the second reference cell circuit close to a lower limit value of the high resistance state, the control circuit included in the second reference cell circuit causes, for each write operation, the application circuit to apply, to one of the first reference cell and the second reference cell included in the second reference cell circuit and determined by the comparator to have a higher resistance value, an electric signal for setting the determined one of the first reference cell and the second reference cell to the high resistance state, and in the output operation, causes the output circuit to electrically connect, to the output terminal, one of the first reference cell and the second reference cell included in the second reference cell circuit and determined by the comparator to have a lower resistance value, and wherein the reference circuit generates a reference level corresponding to an intermediate resistance value between a resistance value of the reference cell connected to the output terminal of the first reference cell circuit and a resistance value of the reference cell connected to the output terminal of the second reference cell circuit.

15. A variable resistance nonvolatile memory device comprising:

a memory cell array including a plurality of memory cells arranged in rows and columns, each of the memory cells including a variable resistance element which reversibly changes between a low resistance state and a high resistance state according to an application of an electric signal, the low resistance state having a resistance value within a first range, the high resistance state having a resistance value within a second range which has a lower limit value higher than an upper limit value of the first range;

a refresh command circuit which includes a reference cell circuit, and outputs a refresh command signal when a resistance value of a reference cell connected to an output terminal of the reference cell circuit becomes a predetermined value; and a control circuit which performs a read operation and then a refresh operation on at least a part of the memory cells in the memory cell array when the refresh command signal is output, the read operation being for reading data from the part of the memory cells, and the refresh operation being for rewriting the read data to the part of the memory cells, wherein the reference cell circuit includes:

a first reference cell and a second reference cell each of which includes a variable resistance element which reversibly changes between the low resistance state and the high resistance state according to an application of an electric signal;

a comparator which compares a resistance value of the first reference cell with a resistance value of the second reference cell;

a control circuit;

an application circuit which applies an electric signal to a reference cell that is one of the first reference cell and the second reference cell and that is selected by the control circuit, the electric signal being for setting the selected reference cell to a target state which is one of the low resistance state and the high resistance state; and an output circuit which electrically connects, to an output terminal, a reference cell that is one of the first reference cell and the second reference cell and that is selected by the control circuit, wherein the control circuit executes a comparison operation and a write operation one or more times, to make the resistance value of the first reference cell or the resistance value of the second reference cell close to a target resistance value that is a lower limit value or an upper limit value of the target state, the comparison operation causing the comparator to perform the comparison, and the write operation causing the application circuit to apply the electric signal to a reference cell that is one of the first reference cell and the second reference cell and that has a resistance value further from the target resistance value according to each result of the comparison by the comparator, and after the write operation, the control circuit executes an output operation which causes the output circuit to electrically connect, to the output terminal, a reference cell that is one of the first reference cell and the second reference cell and that has a resistance value closer to the target resistance value according to a result of the comparison by the comparator.

16. The variable resistance nonvolatile memory device according to claim 15, wherein, to make the resistance value of the first reference cell or the resistance value of the second reference cell close to an upper limit value of the low resistance state, the control circuit causes, for each write operation, the application circuit to apply, to one of the first reference cell and the second reference cell determined by the comparator to have a lower resistance value, an electric signal for setting the determined one of the first reference cell and the second reference cell to the low resistance state, and in the output operation, the control circuit causes the output circuit to electrically connect, to the output terminal, one of the first reference cell and the second reference cell determined by the comparator to have a higher resistance value, and the refresh command circuit outputs the refresh command signal when the resistance value of the reference cell connected to the output terminal of the reference cell circuit increases to a predetermined value.

17. The variable resistance nonvolatile memory device according to claim 15, wherein, to make the resistance value of the first reference cell or the resistance value of the second reference cell close to a lower limit value of the high resistance state, the control circuit causes, for each write operation, the application circuit to apply, to one of the first reference cell and the second reference cell determined by the comparator to have a higher resistance value, an electric signal for setting the determined one of the first reference cell and the second reference cell to the high resistance state, and in the output operation, the control circuit causes the output circuit to electrically connect, to the output terminal, one of the first reference cell and the second reference cell determined by the comparator to have a lower resistance value, and the refresh command circuit outputs the refresh command signal when the resistance value of the reference cell connected to the output terminal of the reference cell circuit decreases to a predetermined value.

18. The variable resistance nonvolatile memory device according to claim 12, wherein, at a manufacturing process of the variable resistance nonvolatile memory device, the control circuit included in each of the at least one reference cell circuit executes the write operation in the reference cell circuit one or more times, and causes the output circuit to electrically connect, to the output terminal, one of the first reference cell and the second reference cell corresponding to the result of the comparison by the comparator.

19. The variable resistance nonvolatile memory device according to claim 12, wherein, while the variable resistance nonvolatile memory device is in a standby state or an idle state, the control circuit included in each of the at least one reference cell circuit causes the application circuit to perform the write operation in the reference circuit one or more times, and causes the output circuit to electrically connect, to the output terminal, one of the first reference cell and the second reference cell corresponding to the result of the comparison by the comparator.

20. The variable resistance nonvolatile memory device according to claim 15, wherein, when the refresh command signal is output, the control circuit included in the reference cell circuit executes the write operation one or more times, and causes the output circuit to electrically connect, to the output terminal, one of the first reference cell and the second reference cell corresponding to the result of the comparison by the comparator.

21. A method for setting a reference cell circuit including a first reference cell and a second reference cell each of which includes a variable resistance element which reversibly changes between a low resistance state and a high resistance state according to an application of an electric signal, the low resistance state having a resistance value within a first range, the high resistance state having a resistance value within a second range which has a lower limit value higher than an upper limit value of the first range, and the method comprising:

applying an electric signal one or more times to a reference cell that is one of the first reference cell and the second reference cell and that has a resistance value further from a target resistance value according to each result of a comparison between a resistance value of the first reference cell and a resistance value of the second reference cell, to make the resistance value of the first reference cell or the resistance value of the second reference cell close to the target resistance value, the target resistance value being a lower limit value or an upper limit value of a target state that is one of the low resistance state and the high resistance state, and the electric signal being for setting the reference cell to the target state; and after the applying, electrically connecting, to an output terminal, one of the first reference cell and the second reference cell which has a resistance value closer to the target resistance value according to a result of a comparison between the resistance value of the first reference cell and the resistance value of the second reference cell.

22. A method for controlling a variable resistance nonvolatile memory device including a plurality of memory cells, a first reference cell and a second reference cell, each of which includes a variable resistance element which reversibly changes between a low resistance state and a high resistance state according to an application of an electric signal, the low resistance state having a resistance value within a first range, the high resistance state having a resistance value within a second range which has a lower limit value higher than an upper limit value of the first range, the memory cells being arranged in rows and columns to form a memory cell array, the first reference cell and the reference cell forming a reference cell circuit, and the method comprising:

applying an electric signal one or more times to a reference cell that is one of the first reference cell and the second reference cell and that has a resistance value further from a target resistance value according to each result of a comparison between a resistance value of the first reference cell and a resistance value of the second reference cell, to make the resistance value of the first reference cell or the resistance value of the second reference cell close to the target resistance value, the target resistance value being a lower limit value or an upper limit value of a target state that is one of the low resistance state and the high resistance state, and the electric signal being for setting the reference cell to the target state;

after the applying, electrically connecting, to an output terminal, one of the first reference cell and the second reference cell which has a resistance value closer to the target resistance value according to a result of a comparison between the resistance value of the first reference cell and the resistance value of the second reference cell;

generating a reference level for determining a resistance state of each of the memory cells, with reference to a resistance value of a reference cell connected to an output terminal of the reference cell circuit; and determining whether each memory cell is in the low resistance state or in the high resistance state by comparing a signal level obtained from the memory cell with the generated reference level.

23. A method for controlling a variable resistance nonvolatile memory device including a plurality of memory cells, a first reference cell and a second reference cell, each of which includes a variable resistance element which reversibly changes between a low resistance state and a high resistance state according to an application of an electric signal, the low resistance state having a resistance value within a first range, the high resistance state having a resistance value within a second range which has a lower limit value higher than an upper limit value of the first range, the memory cells being arranged in rows and columns to form a memory cell array, the first reference cell and the reference cell forming a reference cell circuit, and the method comprising:

applying an electric signal one or more times to a reference cell that is one of the first reference cell and the second reference cell and that has a resistance value further from a target resistance value according to each result of a comparison between a resistance value of the first reference cell and a resistance value of the second reference cell, to make the resistance value of the first reference cell or the resistance value of the second reference cell close to the target resistance value, the target resistance value being a lower limit value or an upper limit value of a target state that is one of the low resistance state and the high resistance state, and the electric signal being for setting the reference cell to the target state;

after the applying, electrically connecting, to an output terminal, one of the first reference cell and the second reference cell which has a resistance value closer to the target resistance value according to a result of a comparison between the resistance value of the first reference cell and the resistance value of the second reference cell;

outputting a refresh command signal when a resistance value of a reference cell connected to an output terminal of the reference cell circuit becomes a predetermined value; and performing a read operation and then a refresh operation on at least a part of the memory cells in the memory cell array when the refresh command signal is output, the read operation being for reading data from the part of the memory cells, and the refresh operation being for rewriting the read data to the part of the memory cells.

24. The variable resistance nonvolatile memory device according to claim 15, wherein, at a manufacturing process of the variable resistance nonvolatile memory device, the control circuit included in the reference cell circuit executes the write operation one or more times, and causes the output circuit to electrically connect, to the output terminal, one of the first reference cell and the second reference cell corresponding to the result of the comparison by the comparator.

* * * * *